(12) United States Patent
Aozasa

(10) Patent No.: US 8,471,233 B2
(45) Date of Patent: Jun. 25, 2013

(54) SEMICONDUCTOR MEMORY AND METHOD OF MANUFACTURING THE SAME

(75) Inventor: Hiroshi Aozasa, Tokyo (JP)

(73) Assignee: Sony Corporation, Tokyo (JP)

( * ) Notice: Subject to any disclaimer, the term of this patent is extended or adjusted under 35 U.S.C. 154(b) by 331 days.

(21) Appl. No.: 12/757,530

(22) Filed: Apr. 9, 2010

(65) Prior Publication Data

US 2010/0264394 A1 Oct. 21, 2010

(30) Foreign Application Priority Data

Apr. 16, 2009 (JP) ................................. 2009-099504

(51) Int. Cl.
*H01L 29/02* (2006.01)
*H01L 47/00* (2006.01)

(52) U.S. Cl.
USPC ............. 257/2; 257/4; 257/E21.078; 438/104

(58) Field of Classification Search
USPC ................................. 257/E21.078, 2; 438/104
See application file for complete search history.

(56) References Cited

U.S. PATENT DOCUMENTS

| | | | | |
|---|---|---|---|---|
| 2005/0226036 | A1* | 10/2005 | Aratani et al. | 365/158 |
| 2006/0092685 | A1* | 5/2006 | Ootsuka et al. | 365/145 |
| 2006/0126423 | A1* | 6/2006 | Aratani et al. | 365/232 |
| 2008/0106923 | A1* | 5/2008 | Lung | 365/129 |
| 2009/0039329 | A1* | 2/2009 | Hofmann et al. | 257/2 |
| 2010/0238707 | A1* | 9/2010 | Tsuchida | 365/148 |

FOREIGN PATENT DOCUMENTS

| | | |
|---|---|---|
| JP | 2006-173267 | 6/2006 |
| JP | 2008-072031 | 3/2008 |

OTHER PUBLICATIONS

K. Aratani et al.; A Novel Resistance Memory with High Scalability and Nanosecond Switching; IEEE; 2007.

* cited by examiner

*Primary Examiner* — Michelle Mandala
*Assistant Examiner* — Shaka White
(74) *Attorney, Agent, or Firm* — Dentons US LLP

(57) ABSTRACT

Disclosed herein is a semiconductor memory including: a first MOS transistor having two diffusion layers formed in a semiconductor substrate; a second MOS transistor which is formed in the semiconductor substrate and has one of the two diffusion layers of the first MOS transistor as a common diffusion layer for the first and second MOS transistors; and a variable resistance element which is formed between side wall insulating films formed at respective side walls of a first gate electrode of the first MOS transistor and a second gate electrode of the second MOS transistor and is connected to the common diffusion layer.

9 Claims, 25 Drawing Sheets

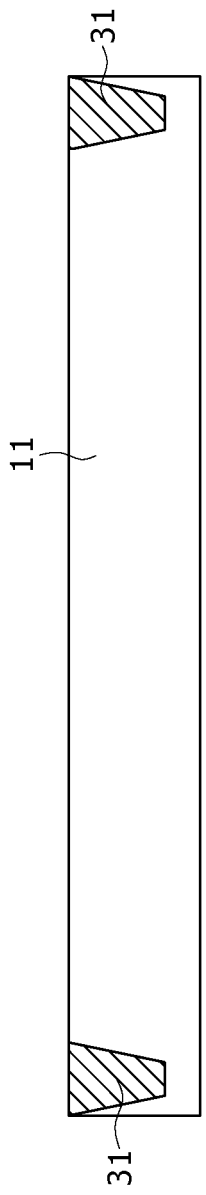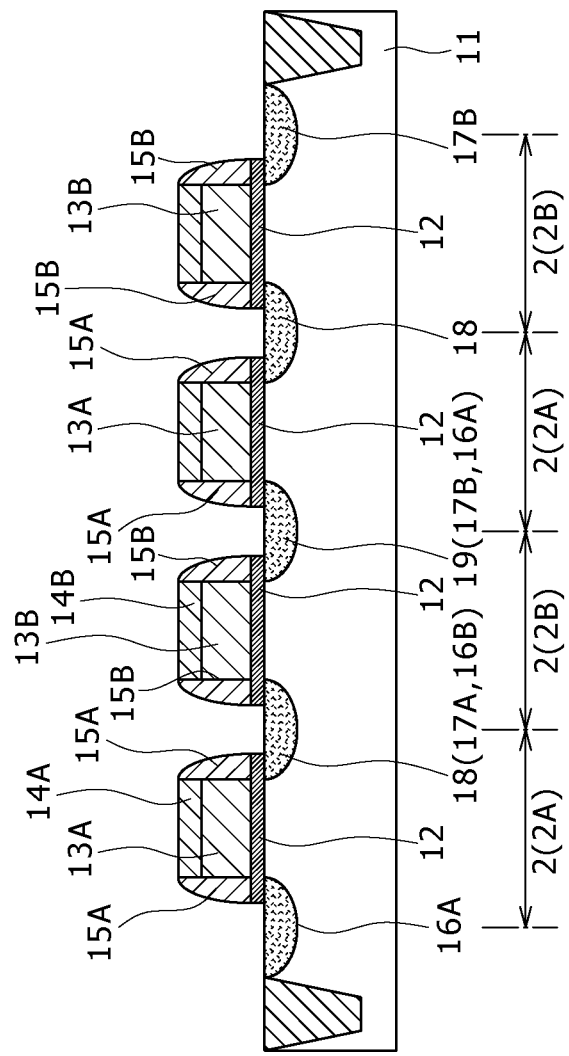

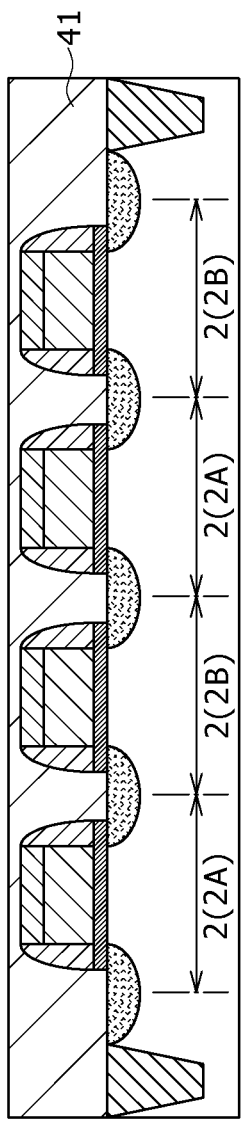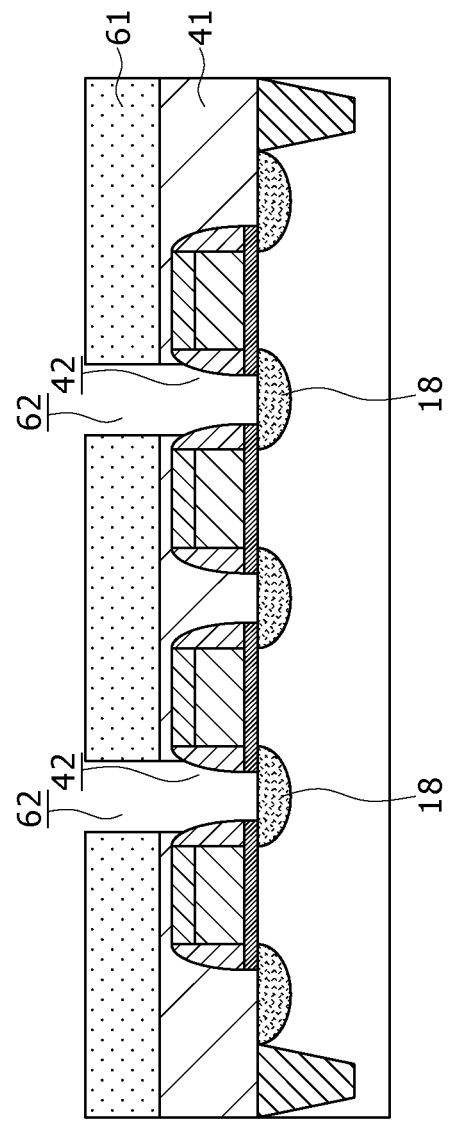

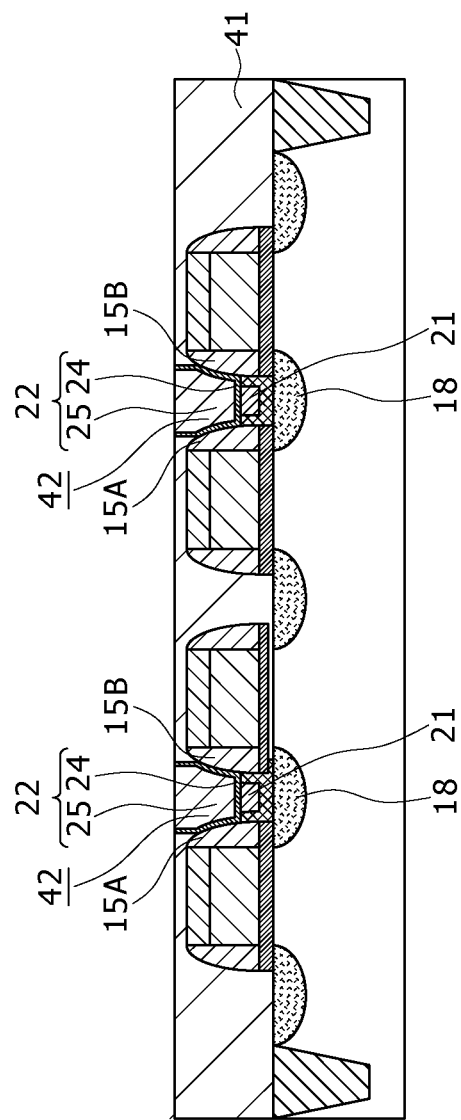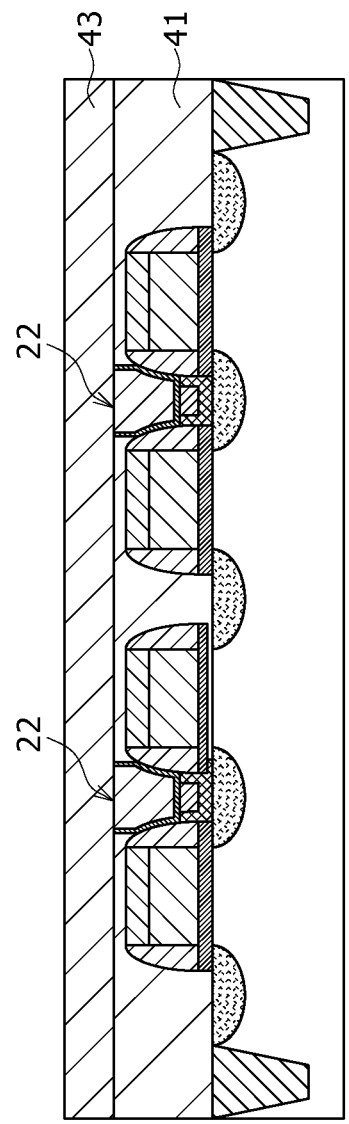

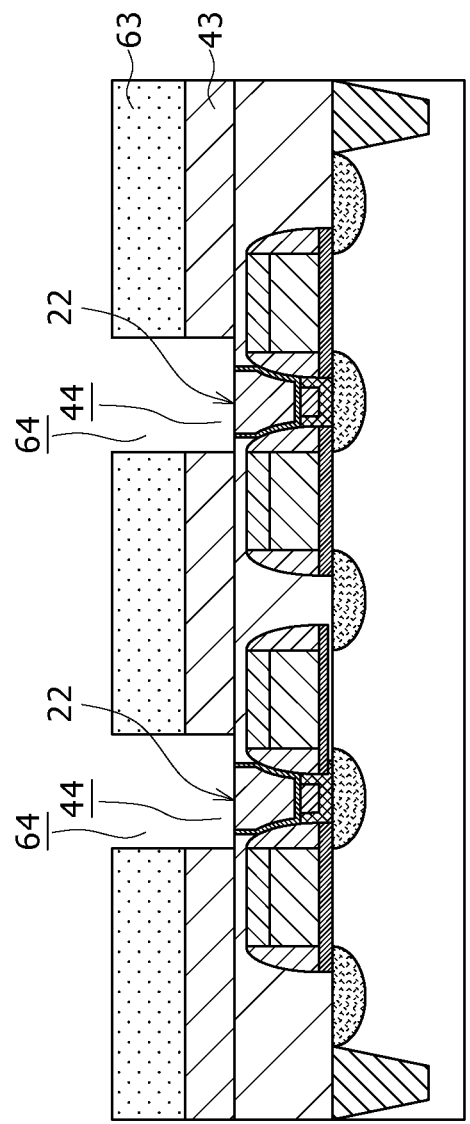
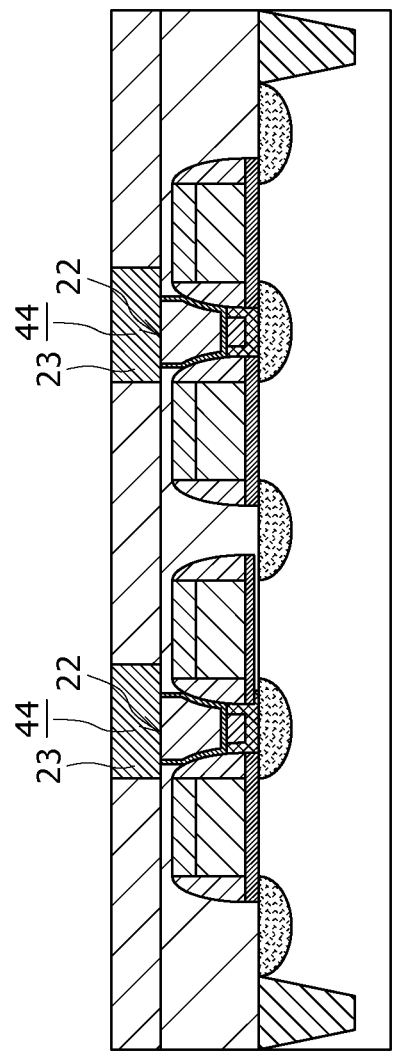

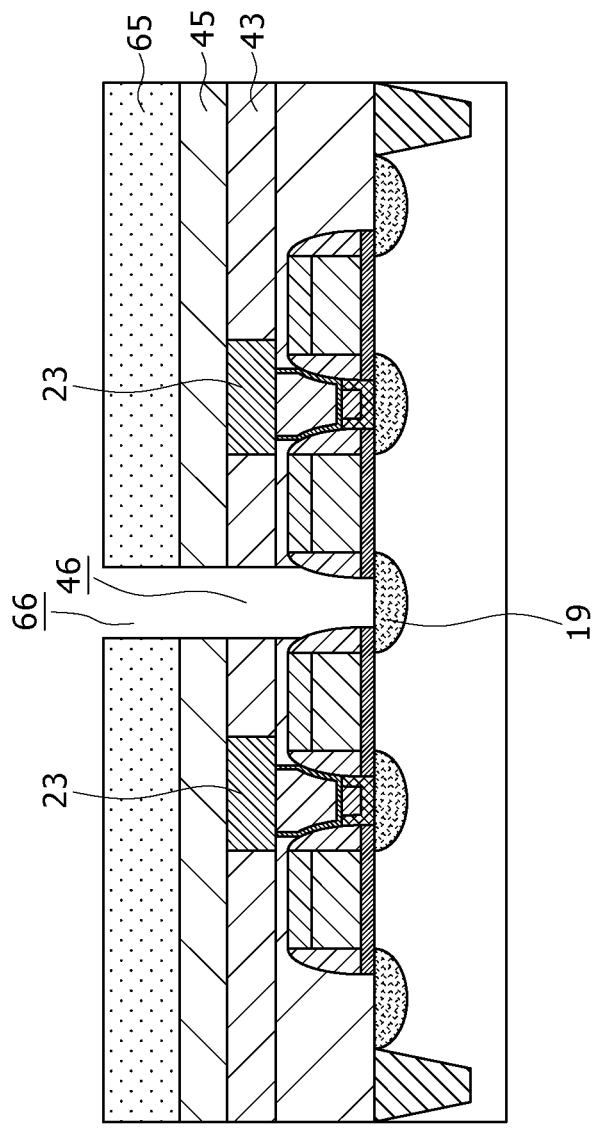

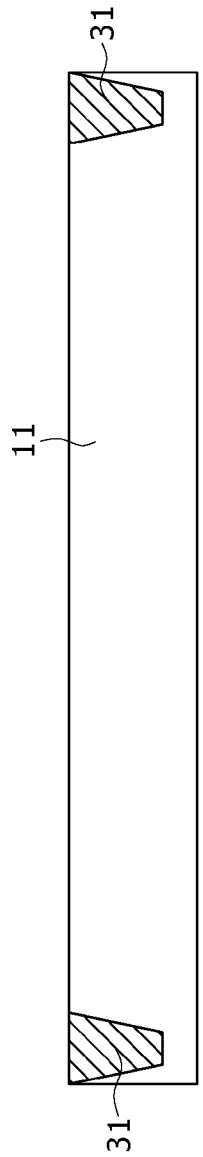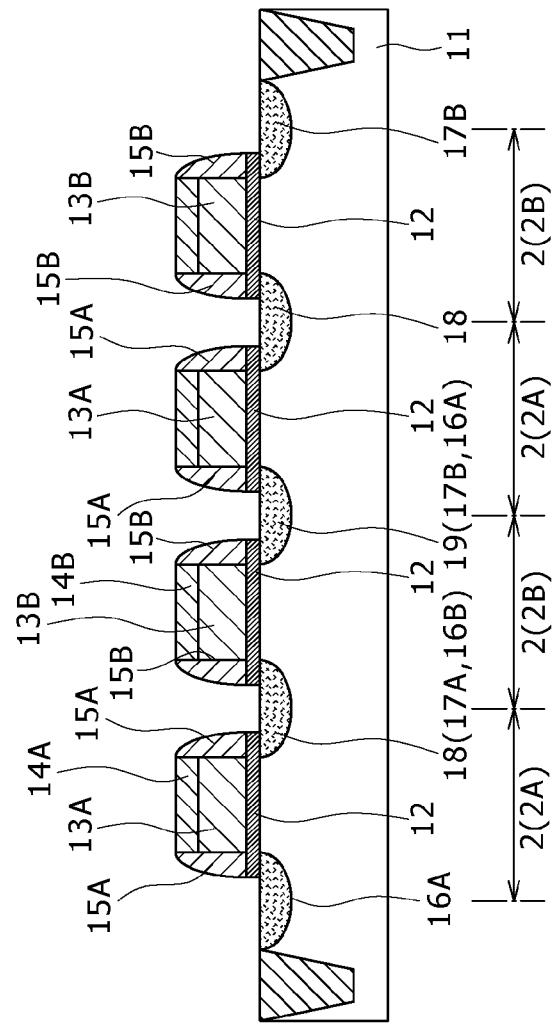

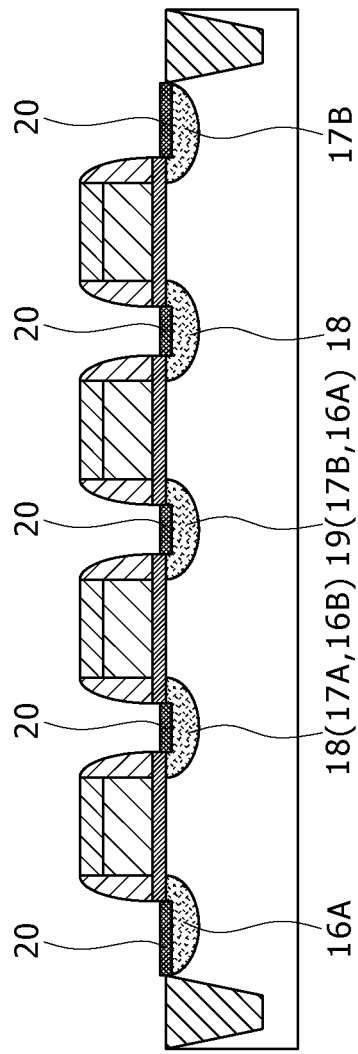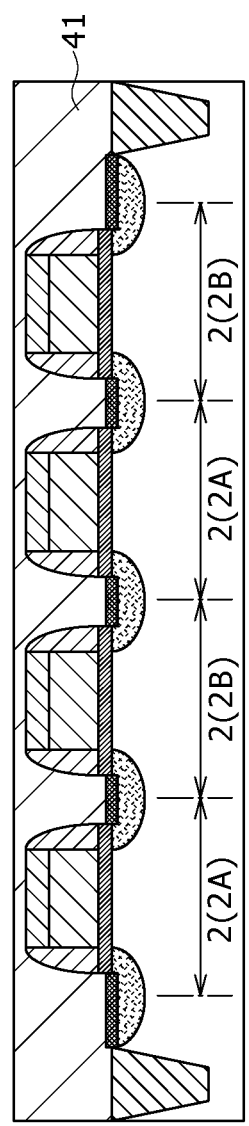

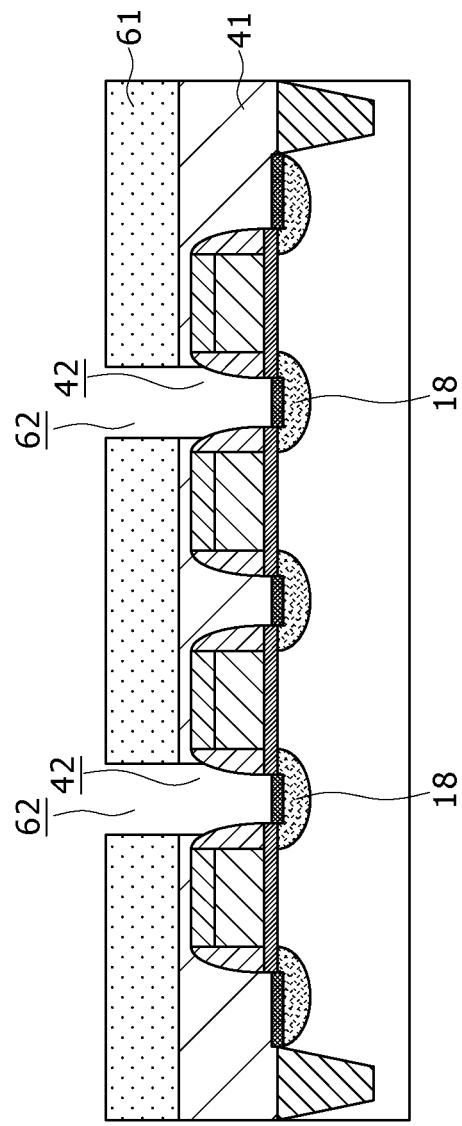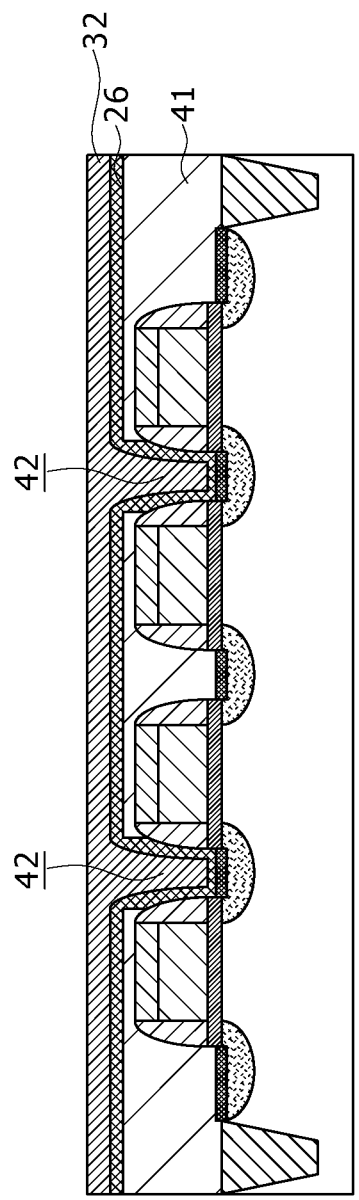

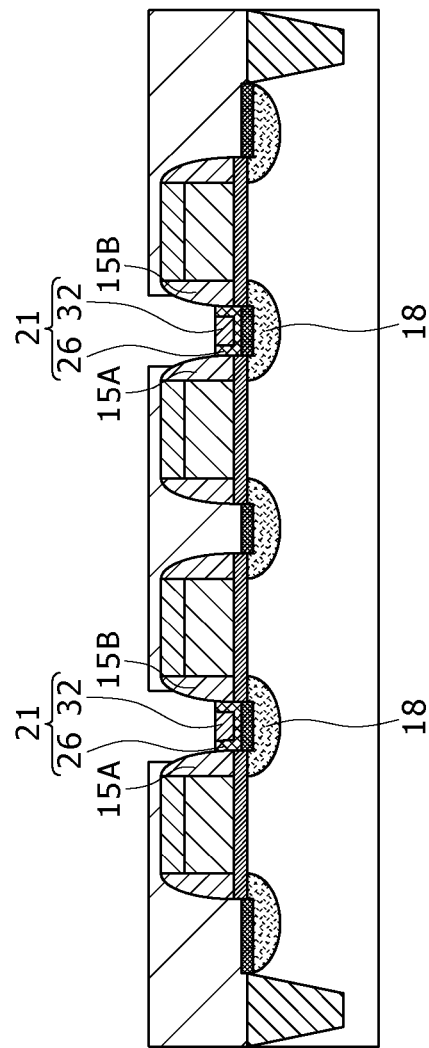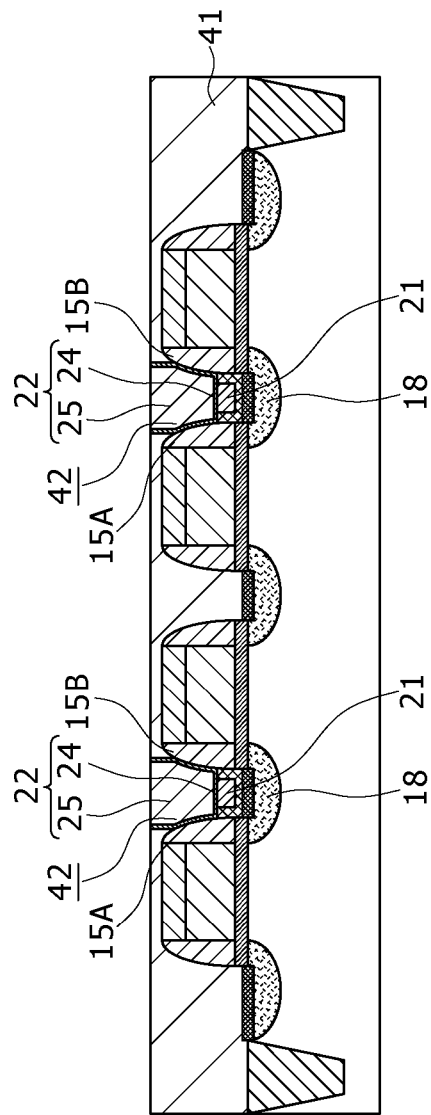

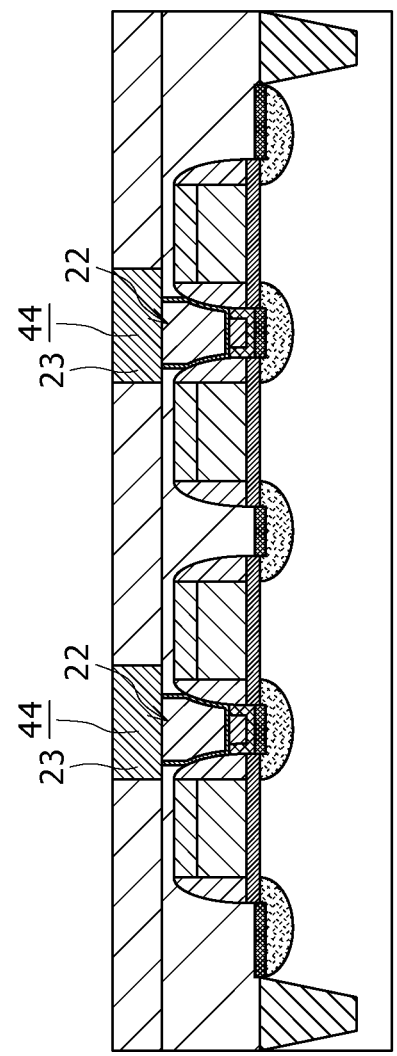

$(V_e - V_{ple} = V_{on} + V_{re})$

SEMICONDUCTOR MEMORY AND METHOD OF MANUFACTURING THE SAME

BACKGROUND OF THE INVENTION

1. Field of the Invention

The present invention relates to a semiconductor memory that utilizes variable resistance (or a change in electrical resistance) and a method of manufacturing the same.

2. Description of the Related Art

According to the increasing demand for higher storage capacity and higher operating speed of memories, the limit in making finer the structure of flash memories is becoming real at present. In such circumstances, variable resistance type storage elements which use resistance change have been proposed as a next-generation memory element technology. Examples of the variable resistance type storage element include ARAM (Atomic Random Access Memory), ReRAM (Resistance Random Access Memory), and PMC (Programmable Metallization Cell). Among these variable resistance storage elements, the ARAM is deemed as a promising technology, since it permits writing and erasing operations to be carried out at high speed (refer to, for example, Japanese Patent Laid-open No. 2006-173267 and K. Aratani, K. Ohba, T. Mizuguchi, S. Yasuda, T. Shimoto, T. Tsushima, "A Novel Resistance Memory with High Scalability and Nanosecond Switching," IEEE IEDM, pp. 783-786, 2007 as Non-patent Document 1, hereinafter).

As shown in FIG. 12, a variable resistance storage element 110 includes a combination of a pair of selection elements 111, such as transistor or diode, with a variable resistance element 112 (refer to, for example, Japanese Patent Laid-open No. 2008-072031 as Patent Document 1, hereinafter). In the case of using the system as a high-capacity memory, a plurality of the variable resistance storage elements 110 are arrayed.

For instance, as shown in an equivalent circuit diagram in FIG. 13, the variable resistance storage element 110 includes a combination of a MOS transistor 113 and a variable resistance element 112.

Now, writing and erasure of data into and from an ARAM type variable resistance storage element will be described below referring to an equivalent circuit diagram shown in FIG. 14.

As shown in FIG. 14, in the ARAM type variable resistance storage element 120, one end of a variable resistance element 122 is connected to one of diffusion layers of a MOS transistor 123. The other end of the variable resistance element 122 is grounded. In addition, the other of the diffusion layers of the MOS transistor 123 is connected to a bit line 124. Further, a word line 125 is connected to a gate electrode of the MOS transistor 123.

Besides, the variable resistance element 122 includes a storage layer which is composed of a metallic oxide film (e.g., gadolinium oxide film) and an ion supply layer which contains copper ions.

Writing and erasing operations in using the ARAM type variable resistance storage element 120 will be described below. Here, the writing operation is defined as an operation of bringing the variable resistance element 122 from a high-resistance state into a low-resistance state.

As shown in FIG. 14, a writing operation in the ARAM type variable resistance storage element 120 is carried out by impressing on the word line 125 a potential $V_g$ such as to put the MOS transistor 123 into a conductive state and impressing a positive potential $V_w$ on a plate line 126.

It is considered that upon this operation, from the ion supply layer that contains metallic ions, e.g., copper ions, the copper ions flow into the storage layer, to form conduction paths in the storage layer. Therefore, low-resistance regions are formed in the storage layer having been in the high-resistance state, with the result that transition from high-resistance state to low-resistance state takes place in the storage layer.

As shown in FIG. 15, erasure of data from the ARAM type variable resistance storage element 120 is carried out by a method in which a voltage $V_g$ such as to bring the MOS transistor 123 into a conductive state is impressed on the gate through the word line 125, like in the writing operation, and simultaneously, a negative potential $V_e$ is impressed on the plate line 126.

It is considered that upon this operation, the metallic ions, e.g., copper ions having been forming the conduction paths in the storage layer are absorbed back into the ion supply layer, so that the low-resistance regions in the storage layer vanish, and transition from low-resistance state to high-resistance state takes place in the storage layer.

In general, at the times of writing and erasing operations, the MOS transistor serving as selection transistor is in the conductive state. In this instance, therefore, the MOS transistor can be deemed as a resistance element on an equivalent basis, so that the system shown in FIG. 15 can be represented by the equivalent circuit shown in FIG. 16.

In this case, as shown in FIGS. 15 and 16, the MOS transistor 123 made finer has a resistance of several kilo-ohms to several tens of kilo-ohms. Therefore, where the resistance of the variable resistance element 122 in the low-resistance state is lower than the resistance of the MOS transistor 123, most of the potential $V_e$ impressed on the bit line 124 undergoes voltage drop through the MOS transistor 123. This may result in that a predetermined voltage $V_{re}$ is not impressed on the variable resistance element 122 and, hence, the desired erasing operation is not completed. Accordingly, a condition for ensuring a stable erasing operation is that the resistance of the variable resistance element 122 in the low-resistance state is set or controlled to be several times higher, or an order(s) of magnitude higher, than the ON resistance of the MOS transistor 123.

For example, let the ON resistance of the MOS transistor 123 be $R_{Tr}$, let the resistance of the variable resistance element 122 be R and let the resistance of wiring and the like be $R_L$, then the condition for causing efficient transition of the variable resistance element 122 from low-resistance state to high-resistance state is $(R_{Tr}+R_L) \ll R$. Therefore, it is required to control the resistance R of the variable resistance element when the MOS transistor 123 is in the ON state. This resistance R is represented by an expression $R = \rho(d/S)$, where $\rho$ is the resistivity determined by the material of the variable resistance element 122, d is the ion conduction distance at the time of writing, and S is the cross-sectional area of the variable resistance element 122. Here, the cross-sectional area S is the area of a section of the variable resistance layer, sandwiched between the electrodes, in a plane orthogonal to the electrode-to-electrode direction. Accordingly, it may be necessary to control the resistance by regulating the cross-sectional area of the variable resistance element.

In addition, as described in Non-patent Document 1, the variable resistance element is formed at the uppermost layer of a wiring layer. Therefore, the selection transistor formed in a silicon substrate and the variable resistance element are interconnected through a plug and wiring, whereby the wiring resistance is increased. This is a major reason why it has been difficult to achieve a stable erasing operation.

Besides, Patent Document 1 discloses a structure in which an insulating film is provided with an aperture for conduction to the drain of the MOS transistor, and the aperture is filled with tungsten to form a tungsten plug. In this structure, the tungsten plug is used as a lower electrode of a variable resistance element, and a tungsten oxide layer to be a variable resistance layer is formed on the lower electrode. In this configuration, however, the variable resistance layer is formed at substantially the same level as the surface of the insulating film covering the MOS transistor. As a result, there is an enlarged distance between the MOS transistor and the variable resistance layer, leading to a raised wiring resistance. For this reason, it has been difficult to achieve a stable erasing operation.

SUMMARY OF THE INVENTION

As above-mentioned, a problem yet to be solved lies in that it is difficult to perform an erasing operation in the variable resistance element in a stable manner, because of the high wiring resistance between the selection transistor and the variable resistance element.

In order to solve the above-mentioned problem, according an approach adopted in an embodiment of the present invention, the resistance of a variable resistance element in its state after writing (in a low-resistance state) is controlled to a desired value, and the wiring resistance between a selection transistor and the variable resistance element is reduced, whereby an erasing operation in using the variable resistance element can be performed in a stable manner.

Specifically, according to an embodiment of the present invention, there is provided a semiconductor memory including: a first MOS transistor having two diffusion layers formed in a semiconductor substrate; and a second MOS transistor which is formed in the semiconductor substrate and has one of the two diffusion layers of the first MOS transistor as a common diffusion layer for the first and second MOS transistors. The semiconductor memory further includes a variable resistance element which is formed between side wall insulating films formed at respective side walls of a first gate electrode of the first MOS transistor and a second gate electrode of the second MOS transistor and is connected to the common diffusion layer.

In the semiconductor memory, the variable resistance element connected to the common diffusion layer for the first and second MOS transistors is provided between the side wall insulating films formed at the respective side walls of the respective first and second gate electrodes of the first and second MOS transistors. This configuration makes it possible to shorten the distance between the variable resistance element and the common diffusion layer, which in turn makes it possible to reduce the wiring resistance component. In addition, where the thicknesses of the first and second side wall insulating films are set to a desired value, the resistance of the variable resistance element after writing can also be controlled to a desired value. As a result, it is possible to realize a condition represented by $(R_{Tr}+R_L)<<R$, where $R_{Tr}$ is the ON resistance of the MOS transistors, $R_L$ is the resistance of wiring and the like, and R is the resistance of the variable resistance element, whereby the erasing operation in the variable resistance element can be performed in a stable manner.

According to another embodiment of the present invention, there is provided a method of manufacturing a semiconductor memory, including the steps of: forming a first electrode and a second electrode over a semiconductor substrate, respectively with a gate insulating film; forming first side wall insulating films and second side wall insulating films at respective side walls of the first electrode and the second electrode; and forming first diffusion layers in the semiconductor substrate on both lateral sides of the first gate electrode. The method further includes the steps of: forming second diffusion layers in the semiconductor substrate on both lateral sides of the second gate electrode in such a manner that one of the second diffusion layers and one of the first diffusion layers constitute a common diffusion layer; and forming a variable resistance element over the common diffusion layer between the first side wall insulating film and the second side wall insulating film.

In the method of manufacturing the variable resistance element, the variable resistance element connected to the common diffusion layer for the first and second MOS transistors is formed between the first and second side wall insulating films formed at the respective side walls of the first and second gate electrodes. Therefore, the distance between the variable resistance element and the common diffusion layers can be shortened and, hence, the wiring resistance component can be reduced. Besides, with the thicknesses of the first and second side wall insulating films set to a desired value, the resistance of the variable resistance element after writing can also be controlled to a desired value. Accordingly, it becomes possible to realize a condition represented by $(R_{Tr}+R_L)<<R$, where $R_{Tr}$ is the ON resistance of the MOS transistor, $R_L$ is the resistance of wiring and the like, and R is the resistance of the variable resistance element. Consequently, an erasing operation in the variable resistance element can be performed in a stable fashion.

The semiconductor memory according to an embodiment of the present invention is advantageous in that, since the erasing operation in the variable resistance element can be performed in a stable manner, a semiconductor memory which operates with high reliability can be provided.

The method of manufacturing the semiconductor memory according to another embodiment of the present invention has a merit in that, since a semiconductor memory promising a stable erasing operation in a variable resistance element can be manufactured, a semiconductor memory which operates with high reliability can be provided.

BRIEF DESCRIPTION OF THE DRAWINGS

FIGS. 6A and 6B are manufacturing step sectional views illustrating a first example of a method of manufacturing a semiconductor memory according to a second embodiment of the invention;

FIGS. 6C to 6L are manufacturing step sectional views illustrating the first example of the method of manufacturing the semiconductor memory;

FIGS. 7A and 7B are manufacturing step sectional views illustrating a second example of the method of manufacturing the semiconductor memory according to the second embodiment of the invention;

FIGS. 7C to 7M are manufacturing step sectional views illustrating the second example of the method of manufacturing the semiconductor memory;

DETAILED DESCRIPTION OF THE PREFERRED EMBODIMENTS

Figure 1:
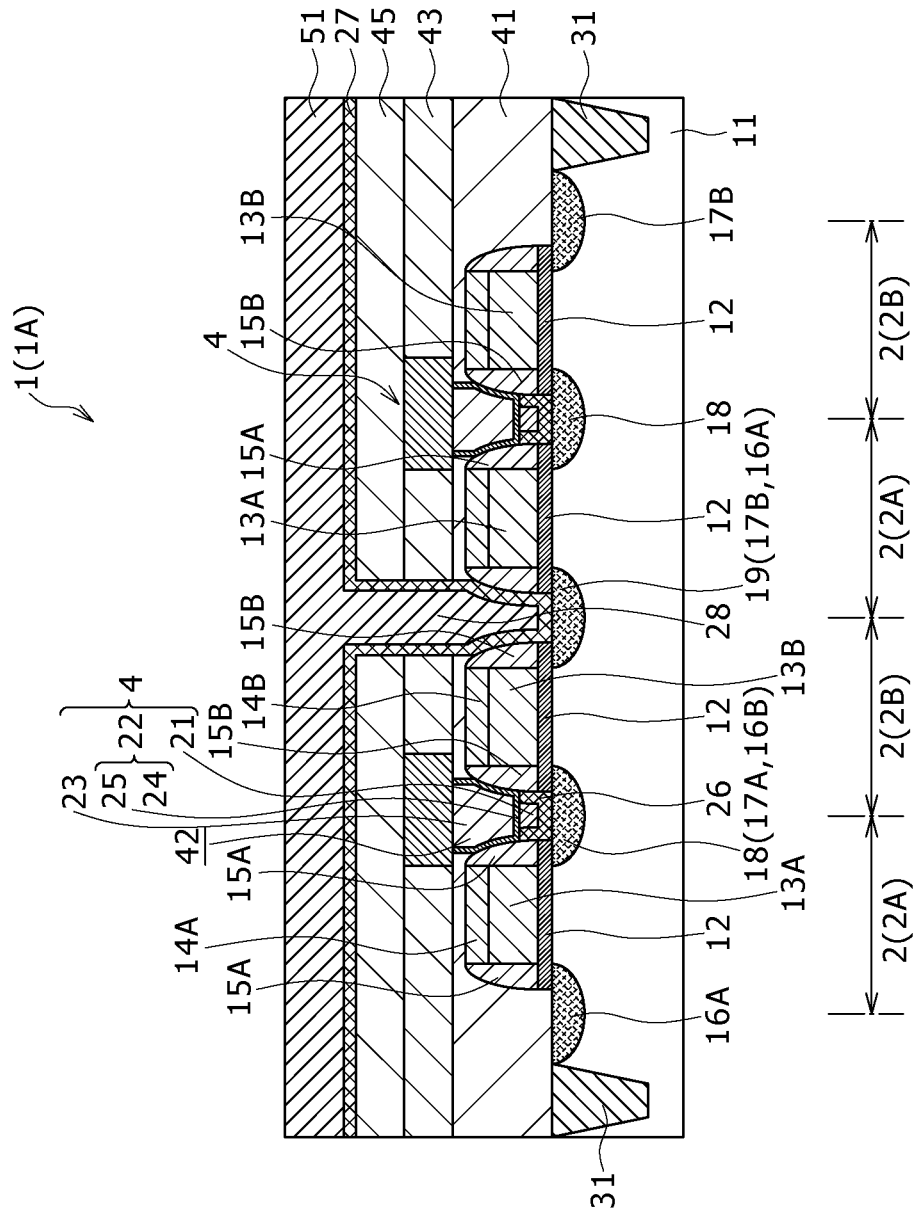
FIG. 1 is a schematic sectional view showing a first example of configuration of a semiconductor memory according to a first embodiment of the present invention.

Now, modes for carrying out the invention (hereinafter referred to as embodiments) will be described below.

<1. First Embodiment>

[First Example of Configuration of Semiconductor Memory]

A first example of the configuration of a semiconductor memory according to a first embodiment of the present invention will be described below, referring to a schematic sectional view shown in FIG. 1. In the drawing, adjacent two sets of MOS transistors, each set having a first MOS transistor and a second MOS transistor, are shown as an example. The second MOS transistor is formed, for example, in a cell adjacent to a cell in which the first MOS transistor is formed.

As shown in FIG. 1, two sets of MOS transistors 2, each set having a first MOS transistor 2 (2A) and a second MOS transistor 2 (2B), are formed on a semiconductor substrate 11.

Specifically, a first gate electrode 13A is formed over the semiconductor substrate 1, with a gate insulating film 12 therebetween, and a first cap insulating film 14A is formed on the upper side of the first gate electrode 13A.

On side walls of the first gate electrode 13A, first side wall insulating films 15A connected to the first cap insulating film 14A are formed.

Further, first diffusion layers 16A and 17A to be source/drain regions are formed in the semiconductor substrate 11 on both lateral sides of the first gate electrode 13A.

The first MOS transistor 2 (2A) is configured in this manner.

In addition, a second gate electrode 13B is formed over the semiconductor substrate 11, with a gate insulating film 12 therebetween, and a second cap insulating film 14B is formed on the upper side of the second gate electrode 13B.

On side walls of the second gate electrode 13B, second side wall insulating films 15B connected to the second cap insulating film 14B are formed.

Further, second diffusion layers 16B and 17B to be source/drain regions are formed in the semiconductor substrate 11 on both lateral sides of the second gate electrode 13B. The second diffusion layer 16B and the first diffusion layer 17A are as a common diffusion layer 18.

The second MOS transistor 2 (2B) is configured in this manner.

The first MOS transistor 2A and the second MOS transistor 2B are each formed in the form of an N-channel MOS transistor; incidentally, they may each be formed in the form of a P-channel MOS transistor.

Furthermore, between the first side wall insulating film 15A and the second side wall insulating film 15B, a variable resistance element 4 is formed over the first diffusion layer 17A (second diffusion layer 16B) that constitutes the common diffusion layer.

The variable resistance element 4 has the following configuration.

For instance, a first interlayer dielectric 41 covering the first MOS transistor 2A and the second MOS transistor 2B is formed over the semiconductor substrate 11. The first interlayer dielectric 41 is formed by use of an interlayer dielectric material which is used in ordinary semiconductor process, for example, a silicon oxide dielectric. Examples of the silicon oxide dielectric include TEOS (tetraethyl orthosilicate), $SiO_2$, NSG, and PSG. Or, alternatively, the first interlayer dielectric 41 may be a film of an organic dielectric, for example, polyparaxylene or polyaryl ether.

The first interlayer dielectric 41 is provided therein with an aperture 42 on the upper side of the common diffusion layer 18. The aperture 42 is so formed that its range along the depth direction of the drawing is within the area over activation regions of the first MOS transistor 2A and the second MOS transistor 2B, or within the area over these activation regions and isolation regions 31 formed in the periphery of the activation regions. This ensures that the aperture located in the area over a given activation region would not be formed to protrude into the area over another activation region adjacent to the given activation region. In other words, the side walls of the aperture 42 extending orthogonally to the depth direction of the drawing are defined by the first interlayer dielectric 41, while the side walls of the aperture 42 extending orthogonally to the left-right direction of the drawing are defined mainly by the first side wall insulating film 15A and the second side wall insulating film 15B.

Between the first side wall insulating film 15A and the second side wall insulating film 15B, a first electrode 21 is formed over the first diffusion layer 17A (second diffusion layer 16B) serving as the common diffusion layer. In other words, the first electrode 21 is so formed as to fill (to be buried in) a bottom-side portion of the aperture 42.

The first electrode 21 is formed by use of a material which is used for wiring in ordinary semiconductor process. Examples of the material which can be used here include tungsten, tungsten nitride, copper, and silicon semiconductor materials. Further examples of the material include aluminum, molybdenum, cobalt, nickel, and metallic silicides. The just-mentioned silicon semiconductor materials include single-crystal silicon, polycrystalline silicon, and amorphous silicon. Besides, these silicon materials contain a conductive impurity. Examples of the conductive impurity include arsenic, phosphorus, antimony, boron, and indium.

Incidentally, where a material which may diffuse toward the side of the silicon oxide, such as copper, is used to form the first electrode 21, it is desirable to preliminarily form a barrier metal layer 26 as shown in the figure. Besides, where moisture may possibly penetrate to the side of the first electrode 21, also, it is desirable to preliminarily form the barrier metal layer 26.

In addition, between the first side wall insulating film 15A and the second side wall insulating film 15B, a variable resistance layer 22 connected to the first electrode 21 is formed in the inside of the aperture 42 over the first electrode 21.

Further, a second electrode 23 is connected to the upper surface of the variable resistance layer 22.

In this manner, the variable resistance element 4 including the first electrode 21, the variable resistance layer 22 and the second electrode 23 is formed.

The variable resistance layer 22 includes, for example, a storage layer 24 which is formed on the side of the first electrode 21 by use of a metallic oxide film, and an ion source layer 25 which is formed on the side of the second electrode 23 and which supplies metallic ions to the storage layer 24 or accepts metallic ions supplied to the storage layer 24.

Incidentally, the variable resistance layer 22 has the storage layer 24 and the ion source layer 25, and, in this case, the part whose resistance is essentially varied is the storage layer 24.

The storage layer 24 is formed by use of, for example, either an oxide selected from the group consisting of gadolinium oxide, tantalum oxide, niobium oxide, aluminum oxide, hafnium oxide, zirconium oxide, and silicon oxide, or a mixture of some of these oxides. These oxides include those ones which contain oxygen in an excess amount or in a deficient amount from a stoichiometric point of view.

On the other hand, the ion source layer 25 contains, for example, an element selected from the group consisting of copper (Cu), silver (Ag), and zinc (Zn), and a chalcogenide element selected from the group consisting of tellurium (Te), selenium (Se), and sulfur (S). Specific examples of the material constituting the ion source layer 25 include CuTe, GeSbTe, CuGeTe, AgGeTe, AgTe, ZnTe, ZnGeTe, CuS, CuGeS, CuSe, and CuGeSe. Furthermore, the ion source layer 25 may contain boron (B) or a rare-earth element or silicon (Si).

Therefore, the ion source layer 25 contains at least one element selected from among Cu, Ag, and Zn. In other words, the ion source layer 25 is a layer which supplies the storage layer 24 with ions of at least one element selected from among Cu, Ag, and Zn, or accepts the ions supplied to the storage layer 24.

The second electrode 23 is formed by use of, for example, tungsten, tungsten nitride, copper, or a silicon semiconductor material. Or, alternatively, the second electrode 23 may be formed by use of aluminum, molybdenum, cobalt, nickel, or a metallic silicide. Incidentally, where a material which may diffuse toward the side of silicon oxide, such as copper, is used to form the second electrode 23, it is desirable to preliminarily form a barrier metal layer (not shown). Besides, where moisture may possibly penetrate to the side of the second electrode 23, also, it is desirable to preliminarily form the barrier metal layer (not shown).

In addition, the second electrode 23 may serves also as a plate wiring. The drawing shows the case where the second electrode 23 serves also as the plate wiring.

Further, a second interlayer dielectric 43 covering the second electrode 23 and a third interlayer dielectric 45 are formed on the upper side of the first interlayer dielectric 41.

In addition, a bit contact part 28 connected to the common diffusion layer 19 (17B, 16A) is formed in the manner of penetrating the third, second and first interlayer dielectrics 45, 43, and 41. The just-mentioned common diffusion layer 19 is a common diffusion layer for one transistor pair, composed of the first MOS transistor 2A and the second MOS transistor 2B described above, and another transistor pair adjacent to the one transistor pair.

Furthermore, a bit line 51 connected to the bit contact part 28 is formed over the third interlayer dielectric 45.

Incidentally, the semiconductor substrate 11 includes in its criterion not only a semiconductor substrate, for example, a silicon substrate but also, for example, a semiconductor layer, such as a silicon layer, which is formed on the interlayer dielectric. Besides, the first MOS transistor 2A and the second MOS transistor 2B to be selection transistors may be formed in the just-mentioned silicon layer.

In addition, the semiconductor substrate 11 is not limited to a semiconductor substrate, and any substrate that promises a similar effect can also be used, for example, a glass substrate on which to fabricate an LCD display or the like.

In the semiconductor memory 1 (1A) as above-described, the variable resistance element 4 connected to the common diffusion layer 18 for the first and second MOS transistors 2A and 2B is provided between the first and second side wall insulating films 15A and 15B formed respectively for the first and second gate electrodes 13A and 13B. Therefore, the distance between the variable resistance element and the common diffusion layer can be shortened, so that the wiring resistance component can be reduced. Besides, with the thicknesses of the first and second side wall insulating films 15A and 15B set to a desired value, the resistance of the variable resistance element after writing can also be controlled to a desired value. Consequently, it is possible to realize a condition represented by $(R_{Tr}+R_L)<<R$, where $R_{Tr}$ is the ON resistance of the MOS transistors 2, $R_L$ is the resistance of wiring and the like, and R is the resistance of the variable resistance element, and it is possible to perform an erasing operation in the variable resistance element in a stable manner.

Thus, a semiconductor memory 1 which operates with high reliability can be provided.

Now, operation of the above-mentioned semiconductor memory 1 will be described below.

The ion source layer 25 contains at least one element selected from among Cu, Ag, and Zn. Thus, the ion source layer 25 is a layer which supplies the storage layer 24 with ions of at least one element selected from among Cu, Ag, and Zn or accepts the ions supplied to the storage layer 24. In the following description, it is assumed, on an exemplary or representative basis, that the ion source layer 25 is formed from CuTe.

A positive potential (plus (+) potential), for example, is impressed on the ion source layer 25 so that the potential on the side of the first electrode 21 becomes negative. This causes Cu in the ion source layer 25 to be ionized, and the resulting Cu ions diffuse into and through the inside of the storage layer 24. The diffusing Cu ions either are coupled with electrons on the first electrode 21 side to be deposited as Cu, or remain in the diffused state in the inside of the storage layer 24. In the cases where Ag or Zn is contained in the ion source layer 25, also, the relevant element is ionized, and the resulting ions behave like the Cu ions.

Then, current paths containing large quantities of Cu are formed in the inside of the storage layer 24, or, alternatively, a multiplicity of defects due to Cu are formed in the inside of the storage layer 24; in any case, the resistance of the storage layer 24 is lowered. Here, again, Ag and Zn also behave like Cu.

Each of the other layers (the ion source layer 25, the first electrode 21, the second electrode 23, etc.) than the storage layer 24 is, originally, lower in resistance than the storage layer 24 in the pre-recording state. Therefore, by lowering the resistance of the storage layer 24, it is possible to lower the variable resistance element 4 (the first electrode 21, the storage layer 24, the ion source layer 25, and the second electrode 23) as a whole.

Thereafter, the positive potential is eliminated, to remove the voltage impressed on the variable resistance element 4, whereon the lowered-resistance state is maintained. This enables recording of information. Where the semiconductor memory 1 is used as a memory in which recording can be performed only once, or so-called PROM, recording is completed by only the above-described recording process.

On the other hand, where the semiconductor memory 1 is applied to a memory in which erasure can be performed, or so-called RAM or EEPROM or the like, an erasing process is needed.

To realize an erasing process, a negative potential (minus (−) potential), for example, is impressed on the ion source layer 25 containing Cu, Ag, or Zn so that the potential on the side of the first electrode 21 becomes positive. This causes Cu, Ag, or Zn constituting the current paths or an impurity level formed in the storage layer 24 is ionized, and the resulting ions migrate through the inside of the storage layer 24 to return into the ion source layer 25.

Then, the current paths or defects based on the presence of Cu, Ag, or Zn disappear from the inside of the storage layer 24, resulting in a rise in the resistance of storage layer 24. Each of the other layers (the ion source layer 25, the first electrode 21, the second electrode 23, etc.) than the storage layer 24 is, originally, low in resistance. Therefore, by raising the resistance of the storage layer 24, it is possible to raise the resistance of the variable resistance element 4 (the first electrode 21, the storage layer 24, the ion source layer 25, and the second electrode 23) as a whole.

Thereafter, the negative potential is eliminated, to remove the voltage impressed on the variable resistance element 4, whereon the raised-resistance state is maintained. This enables erasure of the recorded information.

By repeating the above-mentioned processes, recording (writing) of information into the semiconductor memory 1 and erasure of the recorded information can be performed repeatedly.

[Second Example of Configuration of Semiconductor Memory]

Now, a second example of the configuration of the semiconductor memory according to the first embodiment of the present invention will be described below, referring to a schematic sectional view shown in FIG. 2. In the drawing, adjacent two sets of MOS transistors, each set having a first MOS transistor and a second MOS transistor, are shown as an example.

Figure 2:
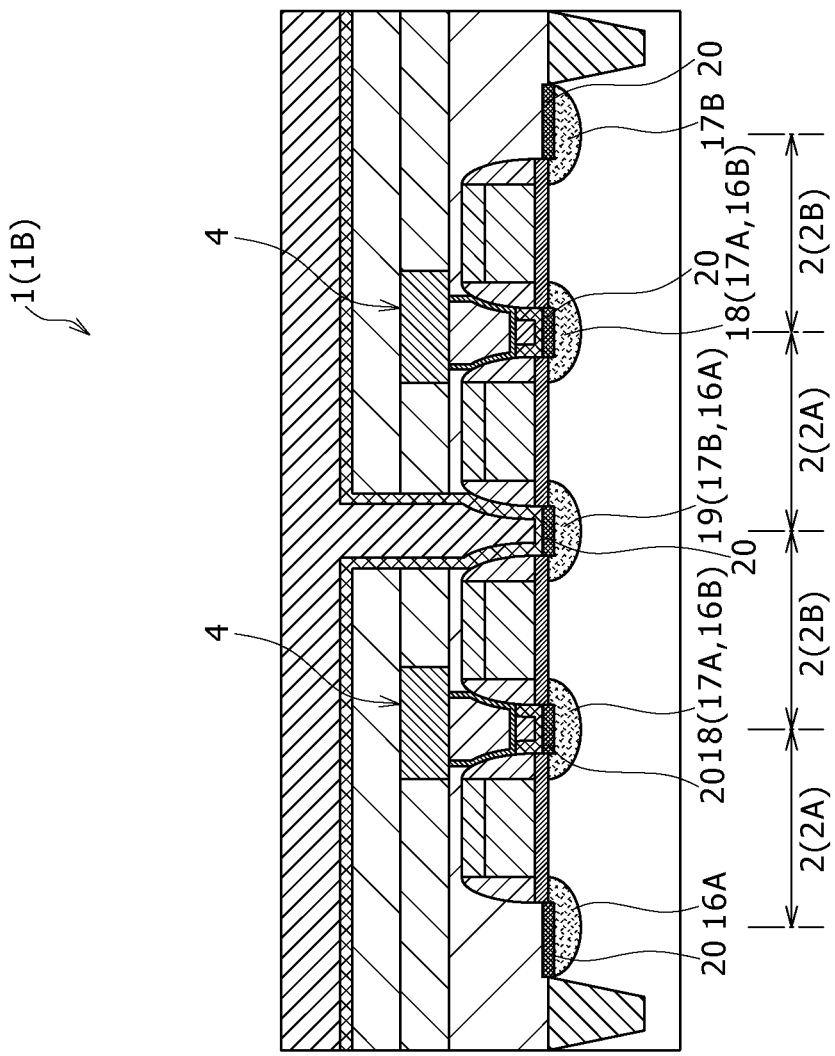
FIG. 2 is a schematic view showing a second example of configuration of the semiconductor memory according to the first embodiment of the invention.

As shown in FIG. 2, a semiconductor memory 1 (1B) in the second example is a semiconductor memory which has basically the same configuration as in the first example above, and in which a silicide layer 20 is formed on the surface of each of the first diffusion layers 16A and 17A and the second diffusion layers 16B and 17B. Thus, the semiconductor memory 1 (1B) in the second example is the same in configuration as the semiconductor memory 1 (1A) in the first example, except that the silicide layer 20 is formed. Here, the case where the silicide layer 20 is additionally formed in the configuration in the first example will be described as an example.

Specifically, the silicide layer 20 is formed on the surface of each of the first diffusion layers 16A and 17A and the second diffusion layers 16B and 17B. The silicide layer 20 is formed, for example, by use of a silicide material which is used in ordinary semiconductor devices. For instance, metallic silicides such as cobalt silicide and nickel silicide can be used here.

In the semiconductor memory 1B, with the silicide layer 20 formed on each of the first diffusion layers 16A and 17A and the second diffusion layers 16B and 17B, the contact resistance between the first electrode 21 and the common diffusion layer 18 is lowered. In other words, the wiring resistance between the variable resistance element 4 and each of the first MOS transistor 2A and the second MOS transistor 2B is lowered. Therefore, a large difference can be secured between the resistance of the variable resistance element 4 and the sum of the ON resistance of the transistor and the wiring resistance. Consequently, the erasing operation in the variable resistance element 4 in the semiconductor memory 1B according to the second example is further stabler than that in the above-described semiconductor memory 1A in the first example.

[Third Example of Configuration of Semiconductor Memory]

Now, a third example of the configuration of the semiconductor memory according to the first embodiment of the present invention will be described below, referring to a schematic sectional view shown in FIG. 3. In the drawing, adjacent two sets of MOS transistors, each set having a first MOS transistor and a second MOS transistor, are shown as an example.

Figure 3:
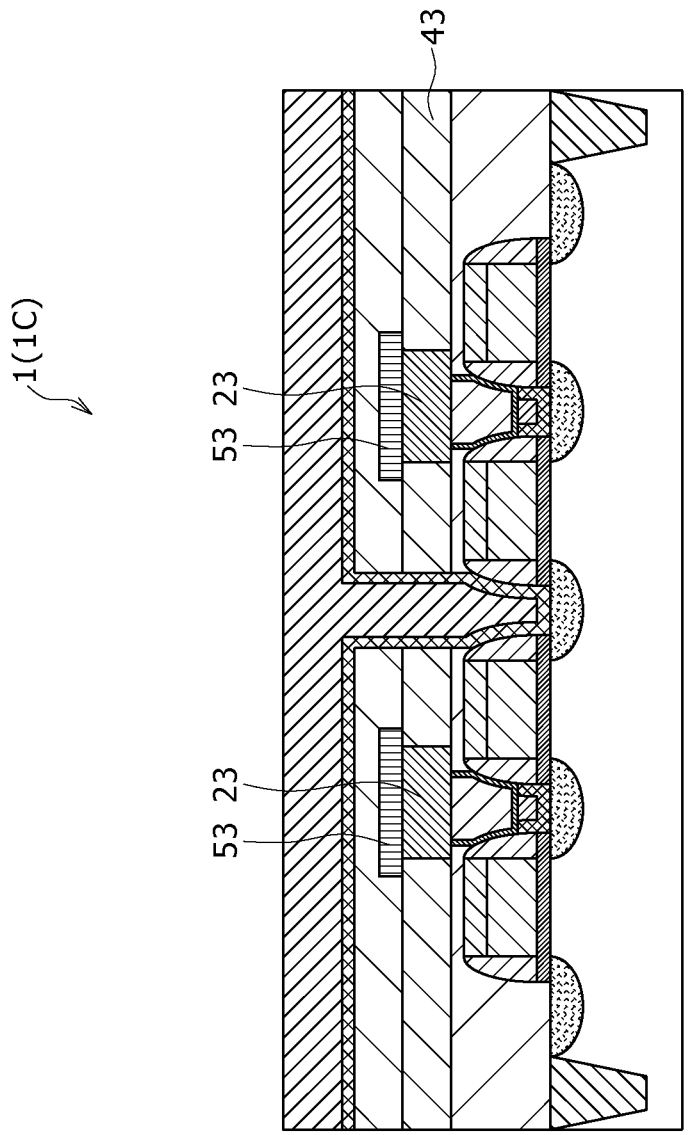
FIG. 3 is a schematic view showing a third example of configuration of the semiconductor memory according to the first embodiment of the invention.

As shown in FIG. 3, a semiconductor memory 1 (1C) in the third example is substantially the same in configuration as those in the first and second examples, except that a plate wiring 53 is formed on the second electrode 23. Here, a configuration in which the plate wiring 53 is additionally formed in the configuration in the first example will be described as an example.

Specifically, the plate wiring 53 connected to the second electrode 23 is formed on the second interlayer dielectric 43. The plate wiring 53 is formed, for example, by use of a wiring material which is used in ordinary semiconductor devices. Examples of the material which can be used here include metallic wiring materials such as copper, tungsten, and aluminum. Incidentally, a barrier metal layer (not shown) is formed in the periphery of the wiring, like in the case of copper wirings in ordinary semiconductor devices.

In the semiconductor memory 1C as above, the plate wiring 53 connected to the second electrode 23 is formed. Therefore, the second electrode 23 can be formed simultaneously with the plug (not shown) formed in the second interlayer dielectric 43 to provide connection between the wiring layers. In addition, since the plate wiring 53 can be formed simultaneously with other wiring layer (not shown) formed over the second interlayer dielectric 43, the degree of freedom in laying around the plate wiring 53 is enhanced.

[Fourth Example of Configuration of Semiconductor Memory]

A fourth example of the configuration of the semiconductor memory according to the first embodiment of the present invention will be described below, referring to a schematic sectional view shown in FIG. 4. In the drawing, adjacent two sets of MOS transistors, each set having a first MOS transistor and a second MOS transistor, are shown as an example.

Figure 4:
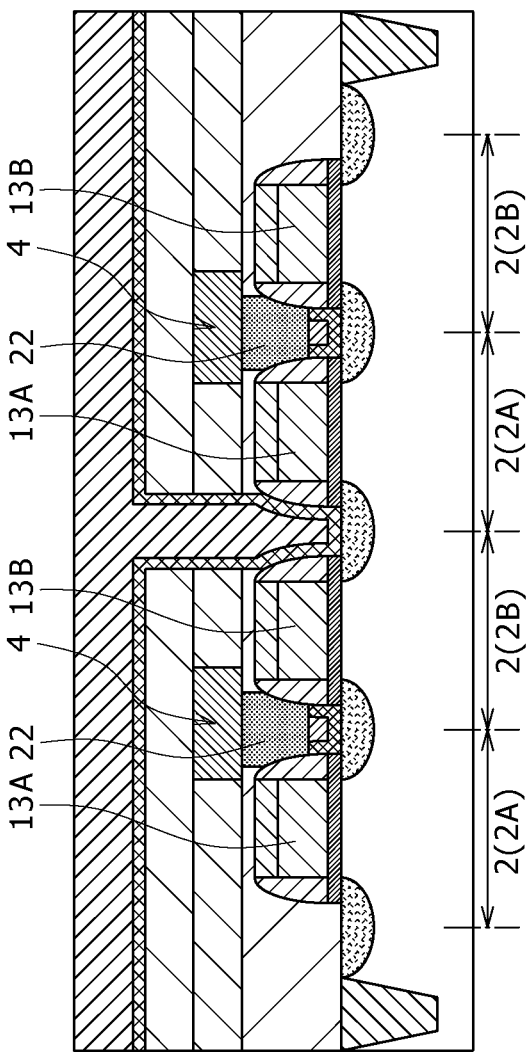
FIG. 4 is a schematic view showing a fourth example of configuration of the semiconductor memory according to the first embodiment of the invention.

As shown in FIG. 4, the semiconductor memory 1 (1D) in the fourth example is substantially the same in configuration as those in the first to third examples above, except for the difference in regard of the variable resistance layer 22 of the variable resistance element 4. Here, a configuration which differs from that of the first example only in the structure of the variable resistance layer 22 will be described as an example.

The variable resistance layer 22 in this example is composed, for example, of a solid electrolyte film. The solid electrolyte film has either one or both of silver (Ag) and copper (Cu), and either one or both of germanium sulfide (GeS), germanium-selenium (GeSe), tin-selenium (SnSe), and tin-germanium-selenium (SnGeSe).

When a voltage is impressed on the variable resistance layer 22, copper or silver in the solid electrolyte film migrates. For example, a phenomenon in which resistance is varied through migration of copper or silver toward the side where a negative potential is impressed is utilized, to produce a difference in the quantity of current flowing in the solid electrolyte film. By utilizing the difference in the quantity of current, information "0" and information "1" are obtained, whereby recording of information and reading of the recorded information are carried out.

The semiconductor memory 1D is configured in this manner.

In the semiconductor memory 1D, like in the first to third examples, the distance between the variable resistance element and the common diffusion layer can be shortened, so that the wiring resistance component can be reduced. In addition, by setting the thicknesses of the first and second side wall insulating films 15A and 15B to a desired value, the resistance of the variable resistance element after writing can also be controlled to a desired value. Therefore, it is possible to realize a condition represented by $(R_{Tr}+R_L) \ll R$, where $R_{Tr}$ is the ON resistance of the MOS transistors 2, $R_L$ is the resistance of wiring and the like, and R is the resistance of the variable resistance element. Accordingly, an erasing operation in the variable resistance element can be performed in a stable manner.

[Fifth Example of Configuration of Semiconductor Memory]

A fifth example of the configuration of the semiconductor memory according to the first embodiment of the present invention will be described below, referring to a schematic sectional view shown in FIG. 5. In the drawing, adjacent two sets of MOS transistors, each set having a first MOS transistor and a second MOS transistor, are shown as an example.

Figure 5:
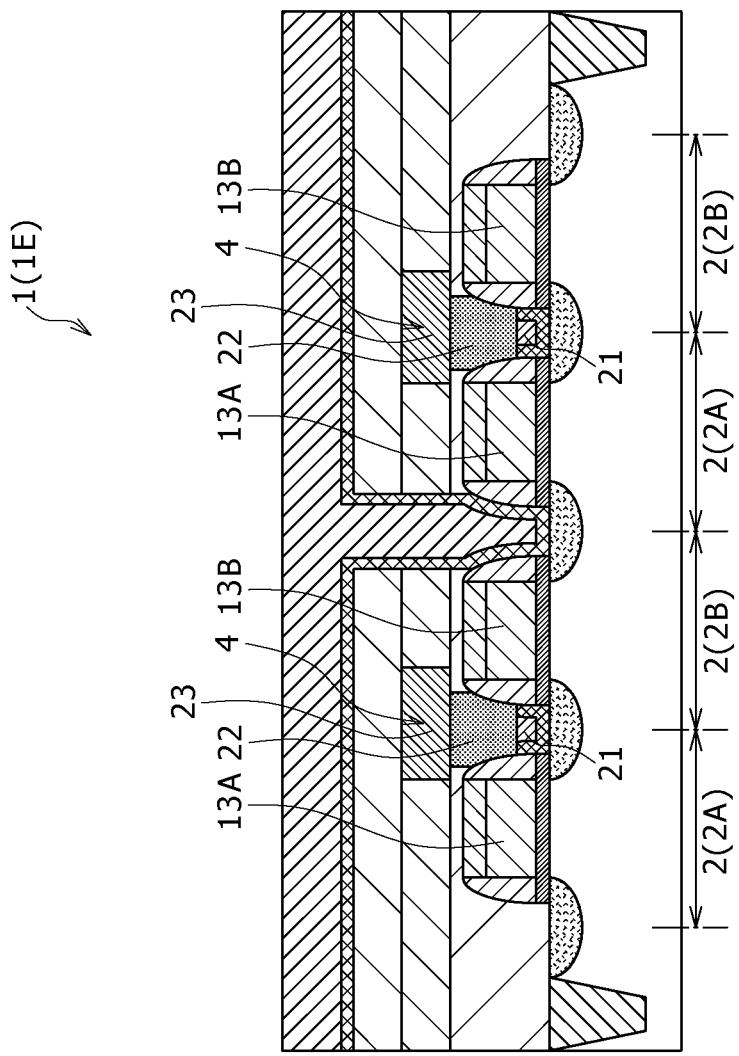
FIG. 5 is a schematic view showing a fifth example of configuration of the semiconductor memory according to the first embodiment of the invention.

As shown in FIG. 5, the semiconductor memory 1 (1E) in the fifth example is substantially the same in configuration as those in the first to third examples above, except for a difference in the structure of the variable resistance layer 22 of the variable resistance element 4. Here, a configuration which differs from that of the first example only in the structure of the variable resistance layer 22 will be described as an example.

The variable resistance layer 22 includes a metallic oxide film. For example, the variable resistance layer 22 is formed of nickel oxide, and is formed between platinum-made first electrode 21 and second electrode 23. Or, alternatively, the variable resistance layer 22 includes a metallic oxide film of a two-layer structure having a titanium oxide film on the first electrode 21 side and a Ti:Ni oxide film, obtained by adding titanium to nickel oxide, on the second electrode 23 side.

Further, the variable resistance layer 22 may have a laminate structure of a cobalt oxide film and a tantalum oxide film. In this case, a tantalum electrode is used as an electrode on the side of a positive electrode.

Other than the above-mentioned, an oxide of a transition metal element such as titanium oxide, zinc oxide, niobium oxide, etc. may be used to form the variable resistance layer 22.

These oxides include those which contain oxygen in an excess amount or in a deficient amount from a stoichiometric point of view.

Or, alternatively, the variable resistance layer 22 may be formed, for example, from copper sulfide ($Cu_2S$).

A phenomenon in which the resistance of the variable resistance layer 22 is varied when a voltage is impressed between the first electrode 21 and the second electrode 23 is utilized to produce a difference in the quantity of current flowing in the variable resistance layer 22. By utilizing the difference in the quantity of current thus produced, information "0" and information "1" are obtained, whereby recording of information and reading of the recorded information are performed.

The semiconductor memory 1E is configured in this manner.

In the semiconductor memory 1E, like in the first to third examples, the distance between the variable resistance element and the common diffusion layer can be shortened, so that the wiring resistance component can be reduced. Besides, by setting the thicknesses of the first and second side wall insulating films 15A and 15B to a desired value, the resistance of the variable resistance element after writing can also be controlled to a desired value. Therefore, it is possible to realize a condition represented by $(R_{Tr}+R_L) \ll R$, where $R_{Tr}$ is the ON resistance of the MOS transistors 2, $R_L$ is the resistance of wiring and the like, and R is the resistance of the variable resistance element. Consequently, an erasing operation in the variable resistance element can be performed in a stable fashion.

<2. Second Embodiment>

[First Example of Method of Manufacturing Semiconductor Memory]

A first example of a method of manufacturing a semiconductor memory according to a second embodiment of the present invention will be described below, referring to manufacturing step sectional views shown in FIGS. 6A to 6L. In each of the drawings, adjacent two sets of MOS transistors, each set having a first MOS transistor and a second MOS transistor, are shown as an example.

As shown in FIG. 6A, isolation regions 31 are formed in a silicon (Si) substrate. A silicon semiconductor substrate, for example, is used as the silicon substrate. In addition, the isolation regions 31 can be formed, for example, in STI (Shallow Trench Isolation) structure, LOCOS structure or the like. As the method for forming the isolation regions 31 in the silicon substrate, those method which are used in ordinary semiconductor process can be used.

Next, as shown in FIG. 6B, a first MOS transistor 2 (2A) and a second MOS transistor 2 (2B) to be selection transistors (selecting elements) are formed by an existing transistor fabrication method.

The first MOS transistor 2A and the second MOS transistor 2B may each be an N-type MOS transistor or a P-type MOS transistor.

Specifically, a first gate electrode 13A and a second gate electrode 13B are formed over the surface of a semiconductor substrate 11, with a gate insulating film 12 therebetween. A first cap insulating film 14A and a second cap insulating film 14B are formed respectively on upper portions of the first gate electrode 13A and the second gate electrode 13B. Each of the first cap insulating film 14A and the second cap insulating film 14B is composed, for example, of an insulator film such as a silicon nitride film, a silicon oxide film, etc.

Next, first side wall insulating films 15A and second side wall insulating films 15B are formed respectively on side walls of the first gate electrode 13A and side walls of the second gate electrode 13B. These side wall insulating films are formed by the same process. For instance, these side wall insulating films are formed by forming a side wall forming film which covers the first gate electrode 13A and the second gate electrode 13B, and thereafter leaving the side wall forming film on the respective side walls of the first gate electrode 13A and the second gate electrode 13B. The side wall forming film is composed, for example, of a silicon nitride film. Or, alternatively, the side wall forming film may be an insulator film other than the silicon nitride film. Examples of the other insulator film include a silicon oxide film, a silicon oxynitride film, and films of two-layer structure or three-layer structure composed of silicon oxide and silicon nitride films.

Subsequently, first diffusion layers 16A and 17A to be source/drain regions are formed in the semiconductor substrate 11 on both lateral sides of the first gate electrode 13A by ion implantation. Simultaneously, second diffusion layers 16B and 17B to be source/drain regions are formed in the semiconductor substrate 11 on both lateral sides of the second gate electrode 13B. In this case, the first diffusion layer 17A and the second diffusion layer 16B are formed as a common diffusion layer 18.

In this manner, the first MOS transistor 2A and the second MOS transistor 2B are formed on the semiconductor substrate 11.

Next, as shown in FIG. 6C, a first interlayer dielectric 41 covering the first MOS transistor 2A and the second MOS transistor 2B is formed over the semiconductor substrate 11. This film forming operation is carried out, for example, by chemical vapor deposition (CVD). The first interlayer dielectric 41 is formed using an interlayer dielectric material which is used in ordinary semiconductor process. For instance, a silicon oxide dielectric is used. Examples of the silicon oxide dielectric include TEOS (tetraethyl orthosilicate), $SiO_2$, NSG, and PSG. Or, alternatively, a film of an organic dielectric such as polyparaxylene, polyaryl ether, etc. may be used as the first interlayer dielectric 41. What is important here is that the material to be used is a material permitting selective etching in relation to the material for forming at least the outermost surface of the first side wall insulating films 15A and the second side wall insulating surface 15B.

Subsequently, as shown in FIG. 6D, a resist film 61 is formed over the first interlayer dielectric 41. Thereafter, by lithography, the resist film 61 is provided with an aperture 62 over each region (the common diffusion layer 18) where the variable resistance element is to be formed. By etching (e.g., dry etching) conducted using this resist film 61 as an etching mask, an aperture 42 is formed in the first interlayer dielectric 41. The aperture 42 is so formed that its range along the depth direction of the drawing is within the area over activation regions of the first MOS transistor 2 and the second MOS transistor 3, or within the area over these activation regions and isolation regions 31 formed in the periphery of the activation regions. This ensures that the aperture located in the area over a given activation region would not be formed to protrude into the area over another activation region adjacent to the given activation region.

Thereafter, the resist film 61 is removed. Incidentally, the drawing shows the condition immediately before the removal of the resist film 61.

Figure 6E:
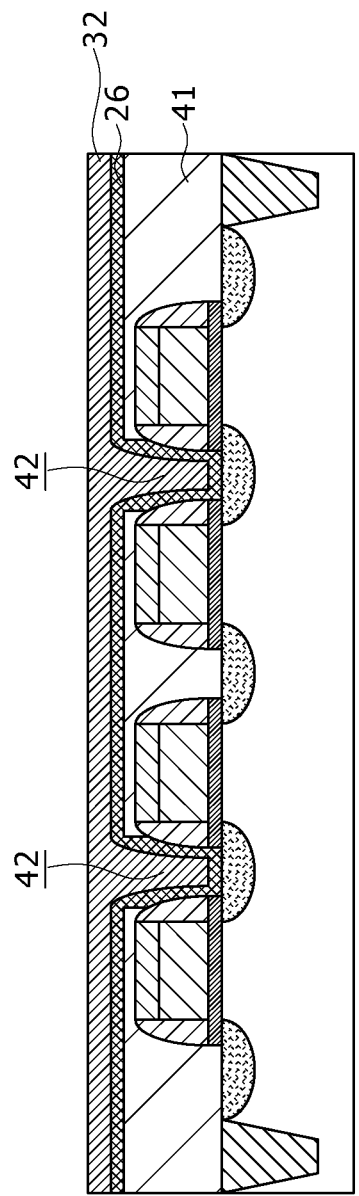

Next, as shown in FIG. 6E, a barrier metal layer 26 is formed on the inside surfaces of the aperture 42 and on the first interlayer dielectric 41. Further, an electrode forming film 32 for forming a first electrode is formed in such a manner as to fill up the aperture 42. The barrier metal layer 26 is composed, for example, of a titanium nitride film or of a laminate film having a titanium film (lower layer) and a titanium nitride film (upper layer). Other than the titanium materials, tantalum materials can also be used to form the barrier metal layer 26. The electrode forming film 32 is formed using a material which is used for wiring in ordinary semiconductor process. Examples of the material include tungsten, tungsten nitride, copper, and silicon semiconductor materials. Or, alternatively, aluminum, molybdenum, cobalt, nickel, metallic silicide, etc. can also be used as the material for the electrode forming film 32. Incidentally, the barrier metal layer 26 may not necessarily be formed. The barrier metal layer 26 is for preventing the metal on the first electrode side from diffusing to the outside, and for preventing corrosive components such as moisture from penetrating from the outside to the first electrode side. Therefore, where the electrode forming film 32 is formed using a material which is free from these problems, it is unnecessary to form the barrier metal layer 26. The case in which it is unnecessary to form the barrier metal layer 26 is a case in which, for example, the electrode forming film 32 is formed using, for example, a silicon semiconductor material, a nitride material, a metallic silicide material or the like.

For forming the barrier metal layer 26 and the electrode forming film 32, existing film forming methods such as sputtering, chemical vapor deposition, etc. can be adopted.

Figure 6F:
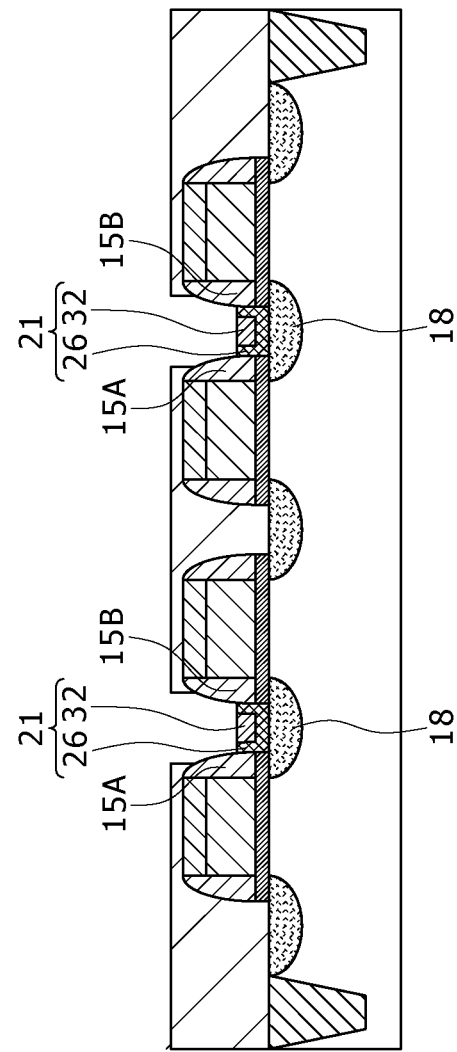

Subsequently, as shown in FIG. 6F, the electrode forming film 32 and the barrier metal layer 26 are etched back. The etch-back is conducted using an anisotropic dry etching technique such as reactive ion etching, and is performed until the areas of the upper surfaces of the electrode forming film 32 and the barrier metal layer 26 become equal to predetermined areas. In this manner, a first electrode 21 including the electrode forming film 32 and the barrier metal layer 26 is formed on the common diffusion layer 18 between the first side wall insulating film 15A and the second side wall insulating film 15B.

Next, as shown in FIG. 6G, a variable resistance layer 22 is formed in the aperture 42 on the upper side of the first electrode 21. In order to form the variable resistance layer 22, for example, a storage layer 24 composed of a metallic oxide is formed on the side of the first electrode 21, and thereafter an ion source layer 25 for supplying metallic ions to the storage layer 24 or accepting the metallic ions supplied to the storage layer 24 is formed on the storage layer 24.

First, the storage layer 24 is formed on the inside surfaces of the aperture 42. In this instance, though not shown, the storage layer 24 is formed also on the first interlayer dielectric 41.

The storage layer 24 is formed from either one of gadolinium oxide, tantalum oxide, niobium oxide, aluminum oxide, hafnium oxide, and zirconium oxide or a mixture of some of these oxides. These oxides include those which contain oxygen in an excess amount or in a deficient amount from a stoichiometric point of view.

Next, the ion source layer 25 is formed on the storage layer 24 in such a manner as, for example, to fill up the aperture 42.

The ion source layer 24 is composed of a film which contains an element selected from the group consisting of copper, silver, and zinc and contains a chalcogenide element selected from the group consisting of tellurium, sulfur, and selenium. For instance, a film of a material selected from among CuTe, GeSbTe, CuGeTe, AgGeTe, AgTe, ZnTe, ZnGeTe, CuS, CuGeS, CuSe, CuGeSe, and the like is formed.

For forming each of the above-mentioned films, those film forming methods which have been used in ordinary semiconductor manufacturing processes, such as sputtering, chemical vapor deposition, atomic layer deposition, etc. can be used.

For example, in the case of forming the storage layer 24 from gadolinium oxide, a film of gadolinium oxide may be directly formed. Or, alternatively, a method may be adopted in which a gadolinium film is formed and thereafter the gadolinium film is oxidized to obtain a gadolinium oxide film. Thus, the storage layer 24 can be formed also by carrying out a film forming step and an oxidizing step.

Subsequently, the ion source layer 25 and the storage layer 24 are partly removed, for example, by etch-back or CMP process or the like so as to expose the surface of the first interlayer dielectric 41. By this treatment, surplus portions of the storage layer 24 and the ion source layer 25 which are formed over the first interlayer dielectric 41 are removed, and the variable resistance layer 22 composed of the storage layer 24 and the ion source layer 25 is formed on the first electrode 21 inside the aperture 42.

In this manner, the first electrode 21 and the variable resistance layer 22 of the variable resistance element 4 are formed over the common diffusion layer 18 between the first side wall insulating film 15A and the second side wall insulating film 15B.

Next, as shown in FIG. 6H, a second interlayer dielectric 43 for covering the variable resistance layer 22 is formed on the first interlayer dielectric 41. The second interlayer insulating film 43 can be formed using a material the same as or similar to the material of the first interlayer dielectric 41 by a film forming method the same as or similar to the film forming method used for the first interlayer dielectric 41.

Subsequently, as shown in FIG. 6I, a resist film 63 is formed on the second interlayer dielectric 43. Thereafter, by lithography, the resist film 63 is provided with an aperture 64 over the region (variable resistance layer 22) where a second electrode of the variable resistance element is to be formed. By etching (e.g., dry etching) conducted using this resist film 63 as an etching mask, an aperture 44 is formed in the second interlayer dielectric 43. In the case where the second electrode serves also as a plate wiring, it suffices to perform patterning of the plate wiring in the patterning of the resist film 63.

Thereafter, the resist film 63 is removed. Incidentally, the drawing shows the condition immediately before the removal of the resist film 63.

Next, as shown in FIG. 6J, the second electrode 23 is formed in the inside of the aperture 44. The second electrode 23 is composed, for example, of tungsten, tungsten nitride, copper, or a silicon semiconductor material. Or, alternatively, the second electrode 23 may be formed using aluminum, molybdenum, cobalt, nickel, a metallic silicide, or the like. Incidentally, it is desirable to form a barrier metal layer (not shown) on the inside surfaces of the aperture 44.

Subsequently, as shown in FIG. 6K, a third interlayer dielectric 45 covering the second electrode 23 is formed on the second interlayer dielectric 43. The third interlayer dielectric 45 can be formed using a material the same as or similar to the material of the first interlayer dielectric 41 by a film forming method the same as or similar to the film forming method used for the first interlayer dielectric 41.

Next, a resist film 65 is formed on the third interlayer dielectric 45. Thereafter, by lithography, the resist film 65 is provided with an aperture 66 over each region (common diffusion layer 19) where a bit contact part of the variable resistance element is to be formed. By etching (e.g., dry etching) conducted using this resist film 65 as an etching mask, an aperture 46 is formed in such a manner as to penetrate the third interlayer dielectric 45, the second interlayer dielectric 43, and the first interlayer dielectric 41.

Thereafter, the resist film 65 is removed. Incidentally, the drawing shows the condition immediately before the removal of the resist film 65.

Figure 6L:
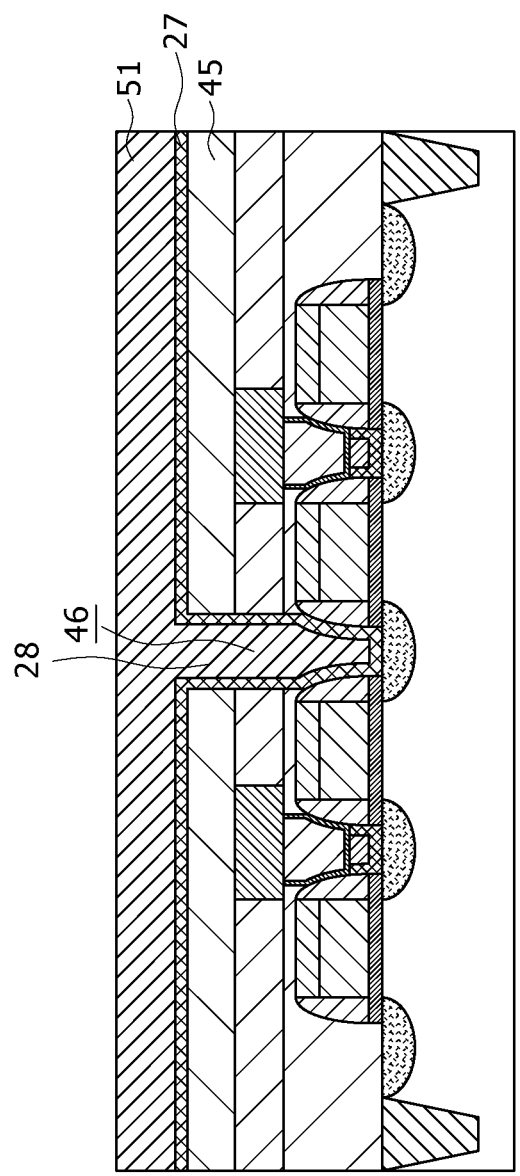

Subsequently, as shown in FIG. 6L, by ordinary plug forming technique and wiring forming technique, the bit contact part 28 and a bit line 51 are formed respectively in the inside of the aperture 46 and on the third interlayer dielectric 45, in the state of being underlain by a barrier metal layer 27. An exemplary method may be adopted in which a fourth interlayer dielectric (not shown) is formed on the third interlayer dielectric 45, and then the bit contact part 28 and the bit line 51 are formed by the so-called dual damascene process. In addition, a method may also be used in which after the bit contact part 28 is formed in the inside of the aperture 46, the bit line 51 to be connected to the bit contact part 28 is formed on the third interlayer dielectric 45 by an ordinary wiring forming technique. Thus, the methods for forming the bit contact part 28 and the bit line 51 are not particularly limited.

Besides, the barrier metal layer 27 is composed, for example, of a titanium nitride film or a laminate film having a titanium film (lower layer) and a titanium nitride film (upper layer). Other than the titanium materials, tantalum materials can also be used to form the barrier metal layer 27. For forming the bit contact part 28, plug materials used in ordinary semiconductor manufacturing processes such as tungsten, copper, etc. can be used.

Each of the barrier metal layer 27, the bit contact part 28, and the bit line 51 can be formed by an existing film forming method, such as sputtering, chemical vapor deposition, etc.

Incidentally, while description about circuitry in other parts than the memory part is omitted in the first example of the manufacturing method above, the memory part can be formed in combination with various logic circuits.

In addition, the semiconductor substrate 11 includes in its criterion not only a semiconductor substrate, for example, a silicon substrate but also, for example, a semiconductor layer, such as a silicon layer, which is formed on the interlayer dielectric. Besides, the first MOS transistor 2A and the second MOS transistor 2B to be selection transistors may be formed in the just-mentioned silicon layer. Further, the semiconductor substrate 11 is not limited to a semiconductor substrate, and any substrate that promises the same effect as above can also be used, for example, a glass substrate on which to fabricate an LCD display or the like.

In the first example of the method of manufacturing the semiconductor memory as above-described, the variable resistance element 4 connected to the common diffusion layer 18 for the first and second MOS transistors 2A and 2B is formed between the first and second side wall insulating films 15A and 15B which are formed respectively on the side walls of the first and second gate electrodes 13A and 13B. This makes it possible to shorten the distance between the variable resistance element and the common diffusion layer and, therefore, to reduce the wiring resistance component. In addition, by setting the thicknesses of the first and second side wall insulating films 15A and 15B to a desired value, the resistance of the variable resistance element after writing can also be controlled to a desired value. Accordingly, it is possible to realize a condition represented by $(R_{Tr}+R_L) \ll R$, where $R_{Tr}$ is the ON resistance of the MOS transistors 2, $R_L$ is the resistance of wiring and the like, and R is the resistance of the variable resistance element. Consequently, an erasing operation in the variable resistance element can be performed in a stable manner.

Therefore, a semiconductor memory 1 (1A) which operates with high reliability can be provided.

[Second Example of Method of Manufacturing Semiconductor Memory]

Now, a second example of the method of manufacturing the semiconductor memory according to the second embodiment of the present invention will be described below, referring to manufacturing step sectional views shown in FIGS. 7A to 7M. In each of the drawings, adjacent two sets of MOS transistors, each set having a first MOS transistor and a second MOS transistor, are shown as an example.

As shown in FIG. 7A, isolation regions 31 are formed in a silicon (Si) substrate. A silicon semiconductor substrate, for example, is used as the silicon substrate. In addition, the isolation regions 31 can be formed, for example, in STI (Shallow Trench Isolation) structure, LOCOS structure or the like. As the method for forming the isolation regions 31 in the silicon substrate, those method which are used in ordinary semiconductor process can be used.

Next, as shown in FIG. 7B, a first MOS transistor 2A and a second MOS transistor 2B to be selection transistors (selecting elements) are formed by an existing transistor fabrication method.

The first MOS transistor 2A and the second MOS transistor 2B may each be an N-type MOS transistor or a P-type MOS transistor.

Specifically, a first gate electrode 13A and a second gate electrode 13B are formed over the surface of a semiconductor substrate 11, with a gate insulating film 12 therebetween. A first cap insulating film 14A and a second cap insulating film 14B are formed respectively on upper portions of the first gate electrode 13A and the second gate electrode 13B. Each of the first cap insulating film 14A and the second cap insulating film 14B is composed, for example, of an insulator film such as a silicon nitride film, a silicon oxide film, etc.

Next, first side wall insulating films 15A and second side wall insulating films 15B are formed respectively on side walls of the first gate electrode 13A and side walls of the second gate electrode 13B. These side wall insulating films are formed by the same process. For instance, these side wall insulating films are formed by forming a side wall forming film which covers the first gate electrode 13A and the second gate electrode 13B, and thereafter leaving the side wall forming film on the respective side walls of the first gate electrode 13A and the second gate electrode 13B. The side wall forming film is composed, for example, of a silicon nitride film. Or, alternatively, the side wall forming film may be an insulator film other than the silicon nitride film. Examples of the other insulator film include a silicon oxide film, a silicon oxynitride film, and films of two-layer structure or three-layer structure composed of silicon oxide and silicon nitride films.

Subsequently, first diffusion layers 16A and 17A to be source/drain regions are formed in the semiconductor substrate 11 on both lateral sides of the first gate electrode 13A by ion implantation. Simultaneously, second diffusion layers 16B and 17B to be source/drain regions are formed in the semiconductor substrate 11 on both lateral sides of the second gate electrode 13B. In this case, the first diffusion layer 17A and the second diffusion layer 16B are formed as a common diffusion layer 18.

In this manner, the first MOS transistor 2A and the second MOS transistor 2B are formed on the semiconductor substrate 11.

Subsequently, as shown in FIG. 7C, a silicide layer 20 is formed on the surface of each of the first diffusion layers 16A and 17A and the second diffusion layers 16B and 17B to be source/drain regions. The silicide layer 20 is formed, for example, from a silicide material used in ordinary semiconductor devices. Examples of the silicide material which can be used here include metallic silicides such as cobalt silicide, nickel silicide, etc.

The silicide layer 20 can be formed by the same method as that for forming an ordinary silicide layer. Specifically, a film of a metal for forming the silicide is formed over the whole substrate surface, and thereafter a heat treatment is conducted so that the metal for forming the silicide is put into reaction with silicon of the semiconductor substrate 11, thereby forming the silicide layer 20. Then, that film of the metal for forming the silicide which is left unreacted is removed by wet etching, for example.

Next, as shown in FIG. 7D, a first interlayer dielectric 41 covering the first MOS transistor 2A and the second MOS transistor 2B is formed over the semiconductor substrate 11. This film forming operation is carried out, for example, by chemical vapor deposition (CVD). The first interlayer dielectric 41 is formed using an interlayer dielectric material which is used in ordinary semiconductor process. For instance, a silicon oxide dielectric is used. Examples of the silicon oxide dielectric include TEOS (tetraethyl orthosilicate), $SiO_2$, NSG, and PSG. Or, alternatively, a film of an organic dielectric such as polyparaxylene, polyaryl ether, etc. may be used as the first interlayer dielectric 41. What is important here is that the material to be used is a material permitting selective etching in relation to the material for forming at least the outermost surface of the first side wall insulating films 15A and the second side wall insulating surface 15B.

Subsequently, as shown in FIG. 7E, a resist film 61 is formed over the first interlayer dielectric 41. Thereafter, by lithography, the resist film 61 is provided with an aperture 62 over each region (the common diffusion layer 18) where the variable resistance element is to be formed. By etching (e.g., dry etching) conducted using this resist film 61 as an etching mask, an aperture 42 is formed in the first interlayer dielectric 41. The aperture 42 is so formed that its range along the depth direction of the drawing is within the area over activation regions of the first MOS transistor 2A and the second MOS transistor 2B, or within the area over these activation regions and isolation regions 31 formed in the periphery of the activation regions. This ensures that the aperture located in the area over a given activation region would not be formed to protrude into the area over another activation region adjacent to the given activation region.

Thereafter, the resist film 61 is removed. Incidentally, the drawing shows the condition immediately before the removal of the resist film 61.

Next, as shown in FIG. 7F, a barrier metal layer 26 is formed on the inside surfaces of the aperture 42 and on the first interlayer dielectric 41. Further, an electrode forming film 32 for forming a first electrode is formed in such a manner as to fill up the aperture 42. The barrier metal layer 26 is composed, for example, of a titanium nitride film or of a laminate film having a titanium film (lower layer) and a titanium nitride film (upper layer). Other than the titanium materials, tantalum materials can also be used to form the barrier metal layer 26. The electrode forming film 32 is formed using a material which is used for wiring in ordinary semiconductor process. Examples of the material include tungsten, tungsten nitride, copper, and silicon semiconductor materials. Or, alternatively, aluminum, molybdenum, cobalt, nickel, metallic silicide, etc. can also be used as the material for the electrode forming film 32. Incidentally, the barrier metal layer 26 may not necessarily be formed. The barrier metal layer 26 is for preventing the metal on the first electrode side from diffusing to the outside, and for preventing corrosive components such as moisture from penetrating from the outside to the first electrode side. Therefore, where the electrode forming film 32 is formed using a material which is free from these problems, it is unnecessary to form the barrier metal layer 26. The case in which it is unnecessary to form the barrier metal layer 26 is a case in which, for example, the electrode forming film 32 is formed using, for example, a silicon semiconductor material, a nitride material, a metallic silicide material or the like.

For forming the barrier metal layer 26 and the electrode forming film 32, existing film forming methods such as sputtering, chemical vapor deposition, etc. can be adopted.

Subsequently, as shown in FIG. 7G, the electrode forming film 32 and the barrier metal layer 26 are etched back. The etch-back is conducted using an anisotropic dry etching technique such as reactive ion etching, and is performed until the areas of the upper surfaces of the electrode forming film 32 and the barrier metal layer 26 become equal to predetermined areas. In this manner, a first electrode 21 including the electrode forming film 32 and the barrier metal layer 26 is formed on the common diffusion layer 18 between the first side wall insulating film 15A and the second side wall insulating film 15B.

Next, as shown in FIG. 7H, a variable resistance layer 22 is formed in the aperture 42 on the upper side of the first electrode 21. In order to form the variable resistance layer 22, for example, a storage layer 24 composed of a metallic oxide is formed on the side of the first electrode 21, and thereafter an ion source layer 25 for supplying metallic ions to the storage layer 24 or accepting the metallic ions supplied to the storage layer 24 is formed on the storage layer 24.

Incidentally, the variable resistance layer 22 has the storage layer 24 and the ion source layer 25, and, in this case, the part whose resistance is essentially varied is the storage layer 24.

First, the storage layer 24 is formed on the inside surfaces of the aperture 42. In this instance, though not shown, the storage layer 24 is formed also on the first interlayer dielectric 41.

The storage layer 24 is formed from either one of gadolinium oxide, tantalum oxide, niobium oxide, aluminum oxide, hafnium oxide, and zirconium oxide or a mixture of some of these oxides. These oxides include those which contain oxygen in an excess amount or in a deficient amount from a stoichiometric point of view.

Next, the ion source layer 25 is formed on the storage layer 24 in such a manner as, for example, to fill up the aperture 42.

The ion source layer 24 is composed of a film which contains an element selected from the group consisting of copper, silver, and zinc and contains a chalcogenide element selected from the group consisting of tellurium, sulfur, and selenium. For instance, a film of a material selected from among CuTe, GeSbTe, CuGeTe, AgGeTe, AgTe, ZnTe, ZnGeTe, CuS, CuGeS, CuSe, CuGeSe, and the like is formed.

For forming each of the above-mentioned films, those film forming methods which have been used in ordinary semiconductor manufacturing processes, such as sputtering, chemical vapor deposition, atomic layer deposition, etc. can be used.

For example, in the case of forming the storage layer 24 from gadolinium oxide, a film of gadolinium oxide may be directly formed. Or, alternatively, a method may be adopted in which a gadolinium film is formed and thereafter the gadolinium film is oxidized to obtain a gadolinium oxide film. Thus, the storage layer 24 can be formed also by carrying out a film forming step and an oxidizing step.

Subsequently, the ion source layer 25 and the storage layer 24 are partly removed, for example, by etch-back or CMP process or the like so as to expose the surface of the first interlayer dielectric 41. By this treatment, surplus portions of the storage layer 24 and the ion source layer 25 which are formed over the first interlayer dielectric 41 are removed, and the variable resistance layer 22 composed of the storage layer 24 and the ion source layer 25 is formed on the first electrode 21 inside the aperture 42.

In this manner, the first electrode 21 and the variable resistance layer 22 of the variable resistance element 4 are formed over the common diffusion layer 18 between the first side wall insulating film 15A and the second side wall insulating film 15B.

Figure 7I:
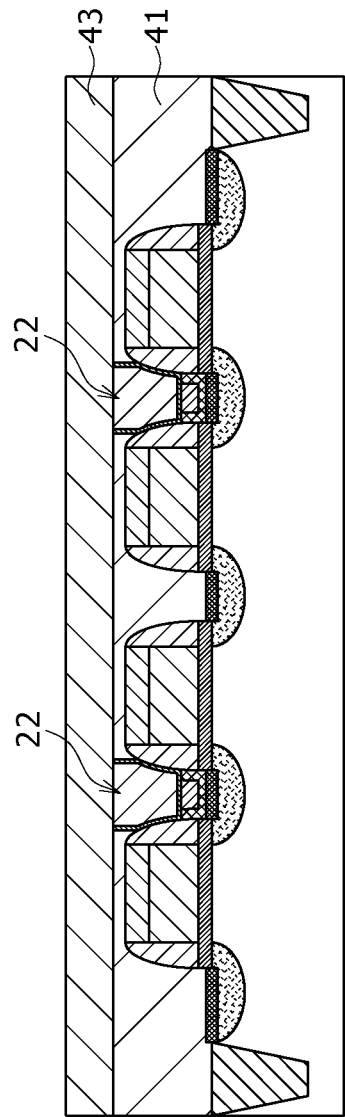
Figure 7J:
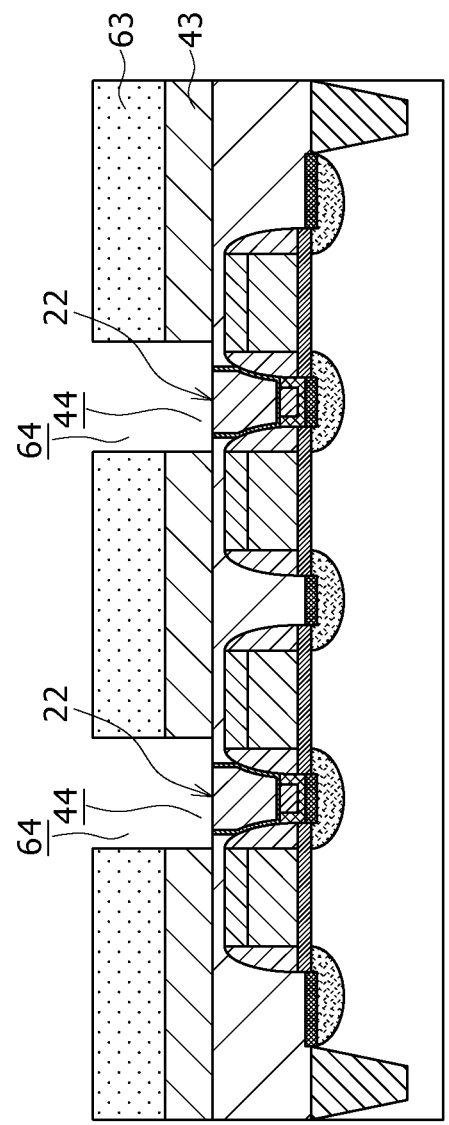
Figure 7L:
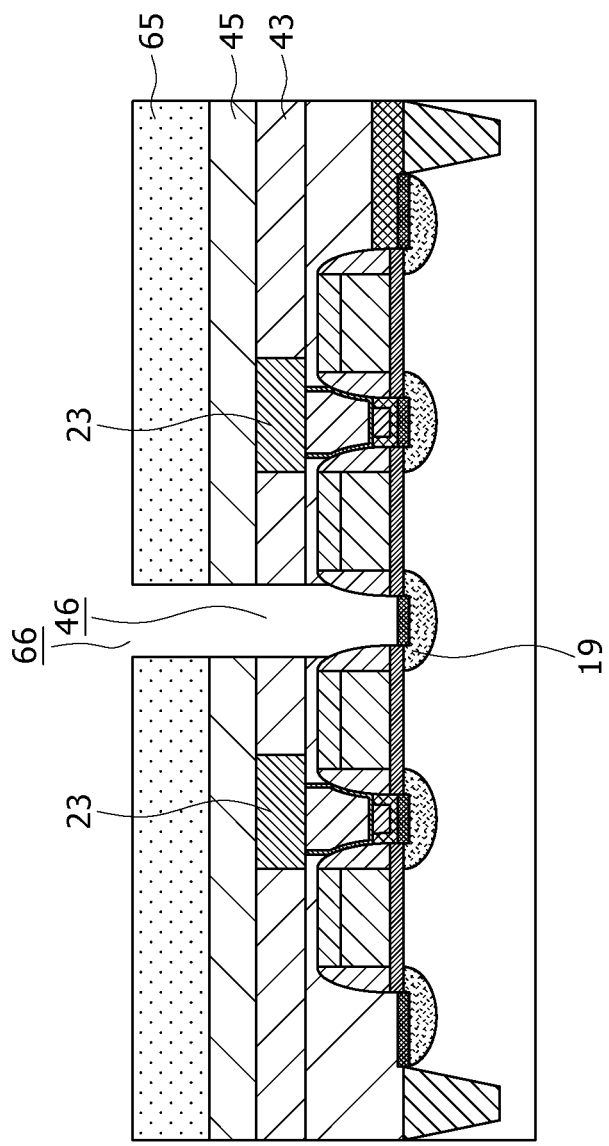

Next, as shown in FIG. 7L, a second interlayer dielectric 43 for covering the variable resistance layer 22 is formed on the first interlayer dielectric 41. The second interlayer insulating film 43 can be formed using a material the same as or similar to the material of the first interlayer dielectric 41 by a film forming method the same as or similar to the film forming method used for the first interlayer dielectric 41.

Subsequently, as shown in FIG. 7J, a resist film 63 is formed on the second interlayer dielectric 43. Thereafter, by lithography, the resist film 63 is provided with an aperture 64 over the region (variable resistance layer 22) where a second electrode of the variable resistance element is to be formed. By etching (e.g., dry etching) conducted using this resist film 63 as an etching mask, an aperture 44 is formed in the second interlayer dielectric 43. In the case where the second electrode serves also as a plate wiring, it suffices to perform patterning of the plate wiring in the patterning of the resist film 63.

Thereafter, the resist film 63 is removed. Incidentally, the drawing shows the condition immediately before the removal of the resist film 63.

Next, as shown in FIG. 7K, the second electrode 23 is formed in the inside of the aperture 44. The second electrode 23 is composed, for example, of tungsten, tungsten nitride, copper, or a silicon semiconductor material. Or, alternatively, the second electrode 23 may be formed using aluminum, molybdenum, cobalt, nickel, a metallic silicide, or the like. Incidentally, it is desirable to form a barrier metal layer (not shown) on the inside surfaces of the aperture 44.

Subsequently, as shown in FIG. 7L, a third interlayer dielectric 45 covering the second electrode 23 is formed on the second interlayer dielectric 43. The third interlayer dielectric 45 can be formed using a material the same as or similar to the material of the first interlayer dielectric 41 by a film forming method the same as or similar to the film forming method used for the first interlayer dielectric 41.

Next, a resist film 65 is formed on the third interlayer dielectric 45. Thereafter, by lithography, the resist film 65 is provided with an aperture 66 over each region (common diffusion layer 19) where a bit contact part of the variable resistance element is to be formed. By etching (e.g., dry etching) conducted using this resist film 65 as an etching mask, an aperture 46 is formed in such a manner as to penetrate the third interlayer dielectric 45, the second interlayer dielectric 43, and the first interlayer dielectric 41.

Thereafter, the resist film 65 is removed. Incidentally, the drawing shows the condition immediately before the removal of the resist film 65.

Figure 7M:
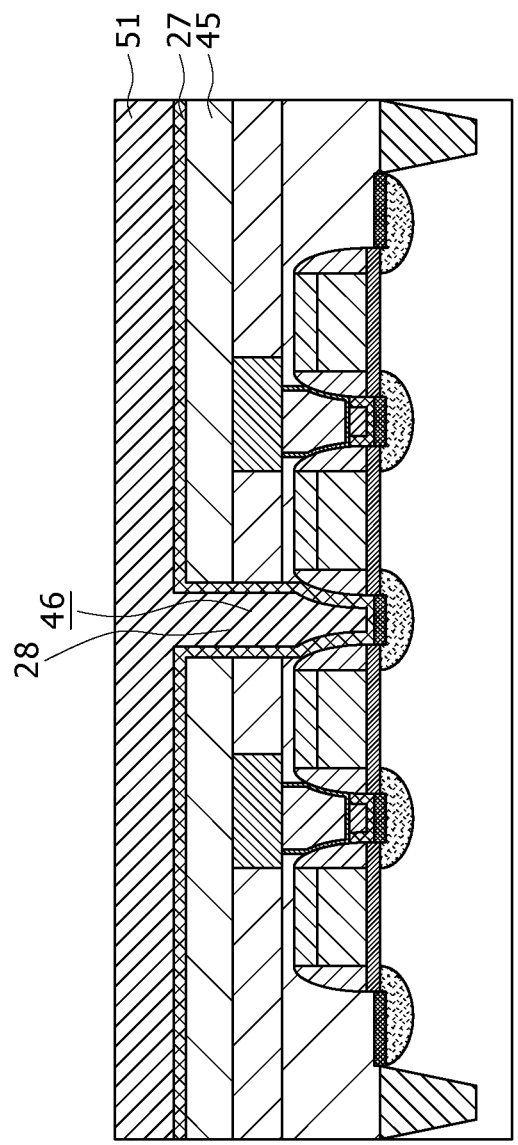

Subsequently, as shown in FIG. 7M, by ordinary plug forming technique and wiring forming technique, the bit contact part 28 and a bit line 51 are formed respectively in the inside of the aperture 46 and on the third interlayer dielectric 45, in the state of being underlain by a barrier metal layer 27. An exemplary method may be adopted in which a fourth interlayer dielectric (not shown) is formed on the third interlayer dielectric 45, and then the bit contact part 28 and the bit line 51 are formed by the so-called dual damascene process.

In addition, a method may also be used in which after the bit contact part 28 is formed in the inside of the aperture 46, the bit line 51 to be connected to the bit contact part 28 is formed on the third interlayer dielectric 45 by an ordinary wiring forming technique. Thus, the methods for forming the bit contact part 28 and the bit line 51 are not particularly limited.

Besides, the barrier metal layer 27 is composed, for example, of a titanium nitride film or a laminate film having a titanium film (lower layer) and a titanium nitride film (upper layer). Other than the titanium materials, tantalum materials can also be used to form the barrier metal layer 27. For forming the bit contact part 28, plug materials used in ordinary semiconductor manufacturing processes such as tungsten, copper, etc. can be used.

Each of the barrier metal layer 27, the bit contact part 28, and the bit line 51 can be formed by an existing film forming method, such as sputtering, chemical vapor deposition, etc.

Incidentally, while description about circuitry in other parts than the memory part is omitted in the second example of the manufacturing method above, the memory part can be formed in combination with various logic circuits.

In addition, the semiconductor substrate 11 includes in its criterion not only a semiconductor substrate, for example, a silicon substrate but also, for example, a semiconductor layer, such as a silicon layer, which is formed on the interlayer dielectric. Besides, the first MOS transistor 2A and the second MOS transistor 2B to be selection transistors may be formed in the just-mentioned silicon layer. Further, the semiconductor substrate 11 is not limited to a semiconductor substrate, and any substrate that promises a similar effect can also be used, for example, a glass substrate on which to fabricate an LCD display or the like.

In the second example of the method of manufacturing the semiconductor memory as above-described, the variable resistance element 4 connected to the common diffusion layer 18 for the first and second MOS transistors 2A and 2B is formed between the first and second side wall insulating films 15A and 15B which are formed respectively on the side walls of the first and second gate electrodes 13A and 13B. This makes it possible to shorten the distance between the variable resistance element and the common diffusion layer and, therefore, to reduce the wiring resistance component. Besides, with the silicide layer 20 formed on the first diffusion layers 16A and 17A and the second diffusion layers 16B and 17B, the contact resistance between the first electrode 21 and the common diffusion layer 18 is reduced. In other words, the wiring resistance between the variable resistance element 4 and each of the first MOS transistor 2A and the second MOS transistor 2B is further reduced. Further, by setting the thicknesses of the first and second side wall insulating films 15A and 15B to a desired value, the resistance of the variable resistance element after writing can also be controlled to a desired value.

Accordingly, it is possible to adopt such a setting as to enlarge the difference between the resistance of the variable resistance element 4 and the sum of the ON resistance of the transistors and the wiring resistance. In other words, the resistance of the variable resistance element in the post-writing state (in the low-resistance state) can be controlled to a desired value. Therefore, it is also possible to realize a condition represented by $(R_{Tr}+R_L)\ll R$, an erasing operation in the variable resistance element 4 can be performed in a further stable manner.

Therefore, a semiconductor memory 1 (1B) which operates with high reliability can be provided.

[Third Example of Method of Manufacturing Semiconductor Memory]

Now, a third example of the method of manufacturing the semiconductor memory will be described below, referring to a schematic sectional view shown in FIG. 8. In the drawing, adjacent two sets of MOS transistors, each set having a first MOS transistor and a second MOS transistor, are shown as an example.

Figure 8:
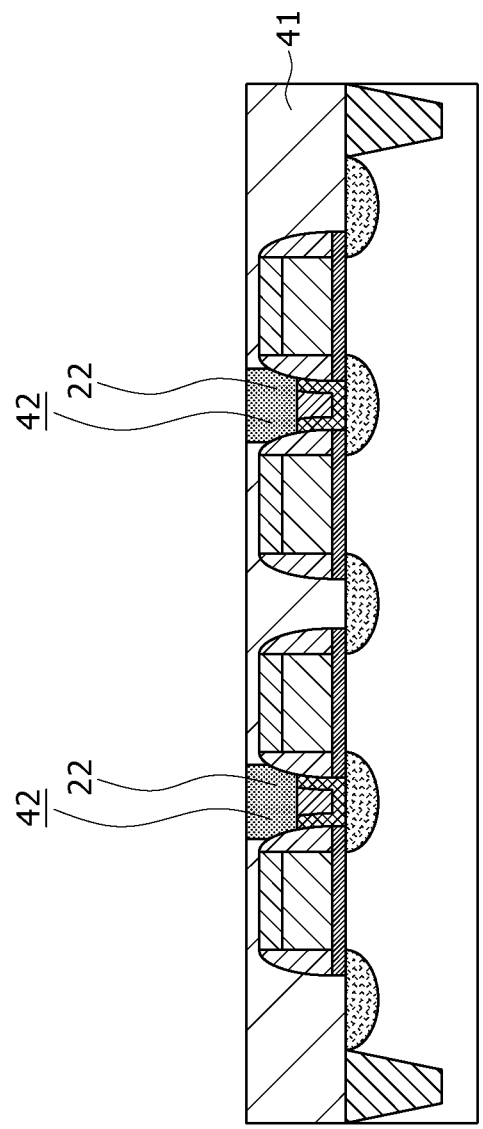
FIG. 8 is a schematic sectional view for illustrating a third example of the method of manufacturing the semiconductor memory.

As shown in FIG. 8, in the methods of manufacturing the semiconductor memory according to the first and second examples above, the variable resistance layer 22 can be composed of a solid electrolyte film. The solid electrolyte film has either one or both of silver (Ag) and copper (Cu) and either one or both of germanium sulfide (GeS) and germanium-selenium (GeSe).

In this case, the solid electrolyte film is formed in such a manner as to fill up the inside of the aperture 42 in which the first electrode 21 has been formed, and the surplus portion of the solid electrolyte formed on the first interlayer dielectric 41 is removed. The removal of the surplus solid electrolyte film is carried out by chemical mechanical polishing (CMP) or etch-back.

The other steps than the step of forming the variable resistance layer 22 are the same as in the methods of manufacturing the semiconductor memory according to the first and second examples described above.

In the third example of the method of manufacturing the semiconductor memory wherein the variable resistance layer 22 is composed of the solid electrolyte film, a working-effect similar to that obtained in the methods of manufacturing the semiconductor memory according to the first and second examples described above can be obtained. Therefore, by setting the thicknesses of the first and second side wall insulating films 15A and 15B to a desired value, the resistance of the variable resistance element after writing can be controlled to a desired value. Accordingly, it is possible to adopt such a setting as to enlarge the difference between the resistance of the variable resistance element 4 and the sum of the ON resistance of the transistors and the wiring resistance. Consequently, an erasing operation in the variable resistance element 4 can be performed in a stable manner.

[Fourth Example of Method of Manufacturing Semiconductor Memory]

Now, a fourth example of the method of manufacturing the semiconductor memory will be described below, referring to a schematic sectional view shown in FIG. 9. In the drawing, adjacent two sets of MOS transistors, each set having a first MOS transistor and a second MOS transistor, are shown as an example.

Figure 9:
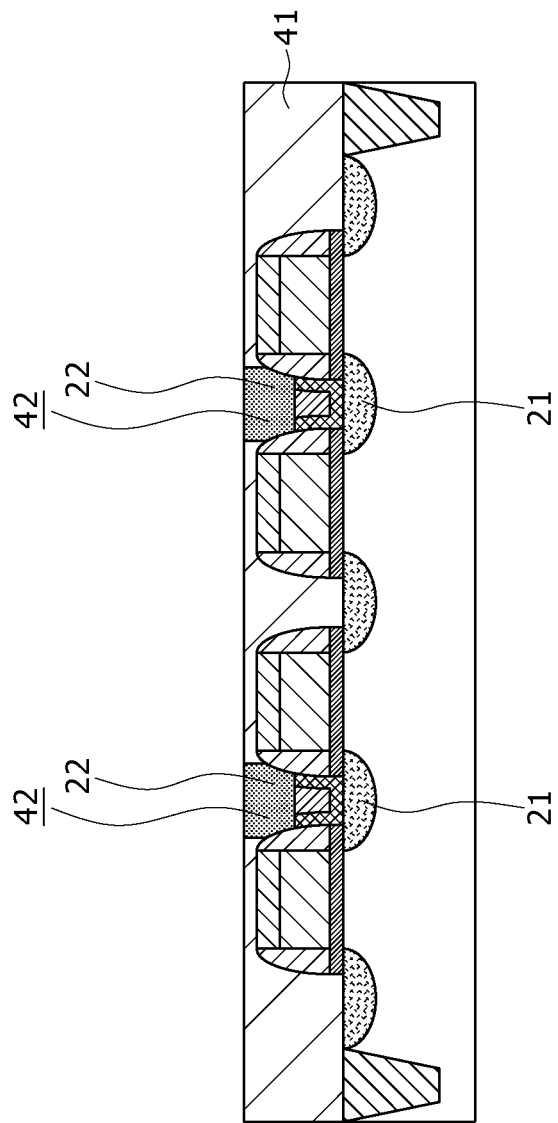
FIG. 9 is a schematic sectional view for illustrating a fourth example of the method of manufacturing the semiconductor memory.

As shown in FIG. 9, in the methods of manufacturing the semiconductor memory according to the first and second examples above, the variable resistance layer 22 can be composed of a metallic oxide film. The metallic oxide film is formed, for example, of an oxide of a transition metal element. Specific examples of the oxide include nickel oxide, titanium oxide, zinc oxide, and niobium oxide. Or, alternatively, a metallic oxide film of a two-layer structure may be adopted wherein a titanium oxide film is formed on the side of the first electrode 21, and a Ti:Ni oxide film obtained by adding titanium to nickel oxide is formed on the titanium oxide film. Further, a laminate structure of a cobalt oxide film and a tantalum oxide film may also be adopted.

These oxides include those which contain oxygen in an excess amount or in a deficient amount from a stoichiometric point of view.

Or, the variable resistance layer 22 may be composed, for example, of copper sulfide ($Cu_2S$).

In the fourth example of the method of manufacturing the semiconductor memory wherein the variable resistance layer 22 is composed of a metallic oxide film or copper sulfide, a working-effect similar to that obtained in the first and second examples described above can be obtained. Therefore, by setting the thicknesses of the first and second side wall insulating films 15A and 15B to a desired value, the resistance of the variable resistance element after writing can be controlled to a desired value. Accordingly, it is possible to adopt such a setting as to enlarge the difference between the resistance of the variable resistance element 4 and the sum of the ON resistance of the transistors and the wiring resistance. Consequently, an erasing operation in the variable resistance element 4 can be performed in a stable manner.

[Modification of Method of Manufacturing Semiconductor Memory]

Now, a modification of the first to fourth examples of the method of manufacturing the semiconductor memory will be described below, referring to a schematic sectional view shown in FIG. 10. In the drawing, adjacent two sets of MOS transistors, each set having a first MOS transistor and a second MOS transistor, are shown as an example.

Figure 10:
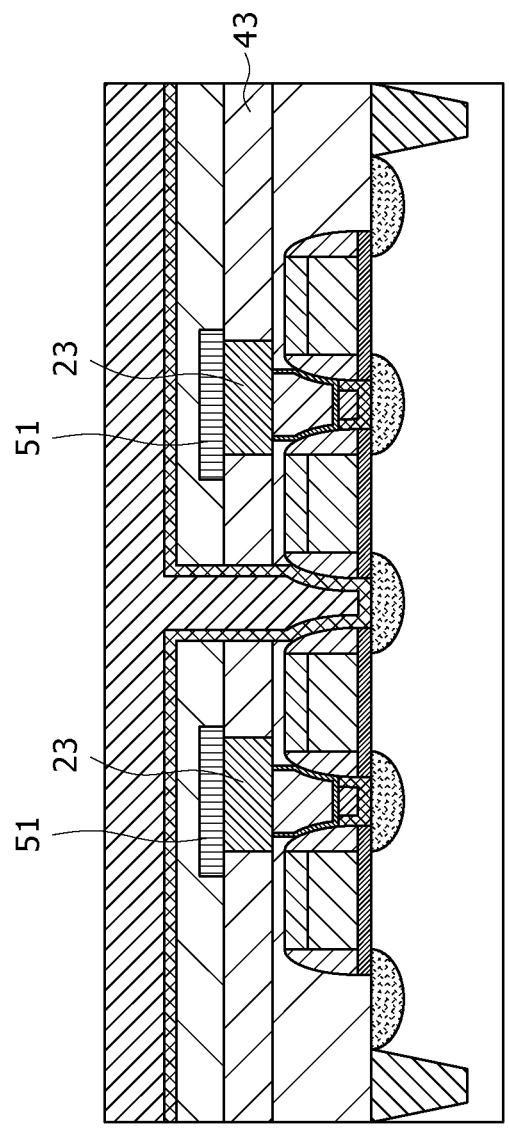
FIG. 10 is a schematic sectional view for illustrating a modification of the method of manufacturing the semiconductor memory.

As shown in FIG. 10, in the methods of manufacturing the semiconductor memory according to the first to fourth examples, a plate wiring 53 connected to the second electrode 23 may be formed on the second interlayer dielectric 43 after the formation of the second electrode 23. In the drawing, a case based on the above-described first example of the manufacturing method is shown as an example. The plate wiring 53 is formed, for example, by use of a wiring material used in ordinary semiconductor devices. For instance, a metallic wiring formed of copper, tungsten, aluminum or the like can be used. Incidentally, a barrier metal layer (not shown) is formed in the periphery of copper wiring, like in the case of copper wiring in ordinary semiconductor devices. Besides, the plate wiring 53 can also be formed by use of the damascene process, for example.

In the modification as above, since the plate wiring 53 connected to the second electrode 23 is formed, it becomes possible to form the second electrode 23 simultaneously with a plug (not shown) for connection between wiring layers formed at the second interlayer dielectric 43. In addition, it becomes possible to form the plate wiring 53 simultaneously with another wiring layer (not shown) formed on the second interlayer dielectric 43. Therefore, the degree of freedom in laying around the plate wiring 53 is enhanced. Besides, since it is unnecessary to form the second electrode 23 and the plate wiring 53 solely, an increase in the number of manufacturing steps is obviated.

[One Example of Layout in Semiconductor Memory]

Now, an example of layout in the semiconductor memory pertaining to the present invention will be described below, referring to a layout plan shown in FIG. 11.

Figure 11:
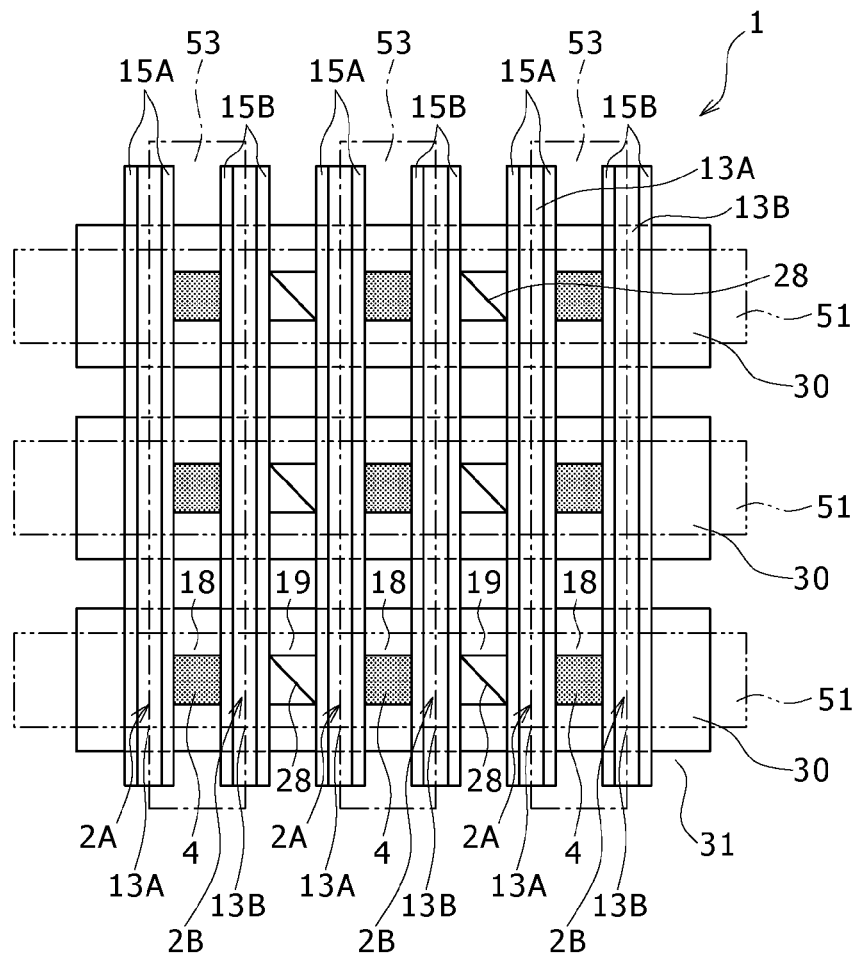
FIG. 11 is a layout plan illustrating an example of the layout in a semiconductor memory according to an embodiment of the invention.
Figure 12:
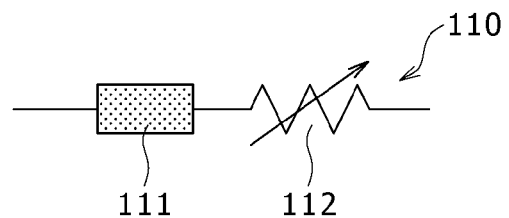
FIG. 12 is a circuit diagram illustrating an example of a variable resistance storage element.
Figure 13:
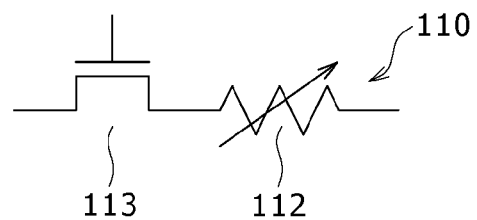
FIG. 13 is an equivalent circuit diagram illustrating an example of the variable resistance storage element.
Figure 14:
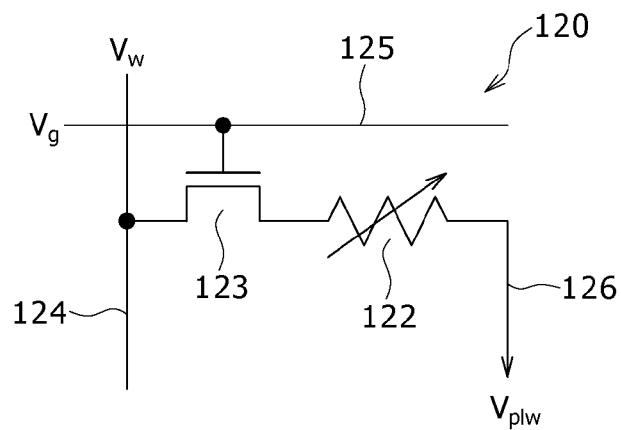
FIG. 14 is a circuit diagram illustrating an ARAM type variable resistance storage element upon writing.
Figure 15:
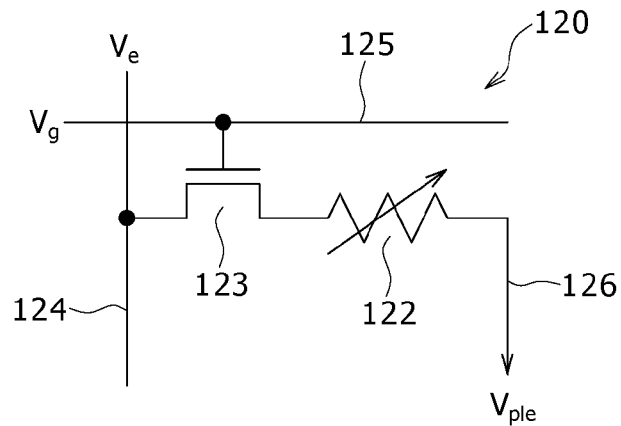
FIG. 15 is a circuit diagram illustrating the ARAM type variable resistance storage element upon erasure.
Figure 16:
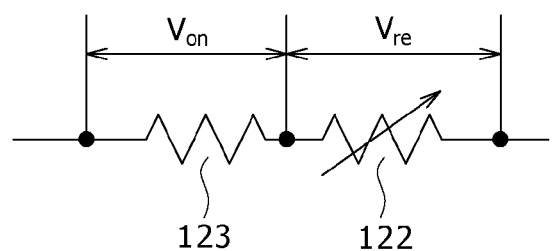
FIG. 16 is an equivalent circuit diagram corresponding to FIG. 15.

As shown in FIG. 11, the semiconductor substrate 11 is provided with a plurality of rows of active regions 30 which are isolated by isolation regions 31 and in which the first MOS transistors 2 (2A) and the second MOS transistors 2 (2B) are formed. For instance, in the case of configuring a memory element array, several hundreds to several tens of thousands of rows of the active regions 30 are arranged, for example.

In the active region 30, three sets of MOS transistors are arranged in series with one another, each set having the first MOS transistor 2 (2A) and the second MOS transistor 2 (2B). While arrangement of three sets of MOS transistors in the active region 30 is shown here as an example, several hundreds to several tens of thousands of sets of MOS transistors, for example, are arranged in the case of constructing a DRAM, for example.

The first side wall insulating films 15A are formed on the side walls of the first gate electrode 13A of the first MOS transistor 2 (2A). Similarly, the second side wall insulating films 15B are formed on the side walls of the second gate electrode 13B of the second MOS transistor 2 (2B). The first gate electrode 13A is composed of a part of a word line 52A, and the second gate electrode 13B is composed of a part of a word line 52B. Naturally, the word lines can also be formed in such a manner as to be connected to the upper surfaces of the gate electrodes. The word lines 52A and 52B are arranged, for example, along the direction orthogonal to the active regions 30.

In the active region 30 on both lateral sides of the first gate electrode 13A, the first diffusion layers 16A and 17A are formed. Similarly, the second diffusion layers 16B and 17B are formed in the active region 30 on both lateral sides of the second gate electrode 13B. Among these components, the first diffusion layer 17A and the second diffusion layer 16B are formed as a common diffusion layer 18. Further, the first diffusion layer 16A and the second diffusion layer 17B are formed as a common diffusion layer 19.

The variable resistance element 4 is formed on the common diffusion layer 18 between the first side wall insulating film 15A and the second side wall insulating film 15B.

The plate wirings 53 are arranged so that each of them is connected to the variable resistance elements 4 arrayed in the column direction. The plate wirings 53 are each arranged, for example, on the upper side of the area between the word lines 52A and 52B, as viewed in the layout plan, so that they may be partly overlapping with each other.

On the upper side of the common diffusion layer 19 for the first MOS transistor 2 (2A) and the second MOS transistor 2 (2B), the bit contact part 28 is formed which is connected to the common diffusion layer 19. Further, the bit lines 51 each connected to the bit contact parts 28 are arranged in the direction orthogonal to the word lines 52A and 52B.

The components of the semiconductor memory 1 are laid out as above.

In the semiconductor memory 1 as above, the variable resistance element 4 connected to the common diffusion layer 18 for the first and second MOS transistors 2A and 2B is provided between the first and second side wall insulating films 15A and 15B which are formed respectively on the side walls of the first and second gate electrodes 13A and 13B. As a result, the distance between the variable resistance layer 22 of the variable resistance element 4 and the common diffusion layer 18 is shortened, and the wiring resistance component is reduced, as compared to that in the related art. In addition, by setting the thicknesses of the first and second side wall insulating films 15A and 15B to a desired value, the resistance of the variable resistance element after writing can be controlled to a desired value.

Therefore, the resistance of the variable resistance element in the post-writing state (in the low-resistance state) can be controlled to a desired value, and such a control as to establish a condition represented by $(R_{Tr}+R_L) \ll R$, can be performed. Accordingly, an erasing operation in the variable resistance element 4 can be performed in a stable manner.

Consequently, a semiconductor memory 1 which operates with high reliability can be provided.

The present application contains subject matter related to that disclosed in Japanese Priority Patent Application JP 2009-099504 filed with the Japan Patent Office on Apr. 16, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor memory comprising:
a first MOS transistor having two diffusion layers formed in a semiconductor substrate;
a second MOS transistor which is formed in the semiconductor substrate and has one of the two diffusion layers of the first MOS transistor as a common diffusion layer for the first and second MOS transistors; and
a variable resistance element which is formed between side wall insulating films formed at respective side walls of a first gate electrode of the first MOS transistor and a second gate electrode of the second MOS transistor and is connected to the common diffusion layer,
wherein,
the variable resistance element comprises
(a) a first electrode formed over the common diffusion layer between the side wall insulating films,
(b) a variable resistance layer formed between the side wall insulating films over the first electrode, the variable resistance layer comprising (i) a storage layer formed on the side of the first electrode, and (ii) an ion source layer which supplies metallic ions to the storage layer or accepts metallic ions supplied to the storage layer, and
(c) a second electrode formed over the variable resistance layer.

2. The semiconductor memory according to claim 1, wherein the second MOS transistor is formed in a cell adjacent to a cell in which the first MOS transistor is formed.

3. The semiconductor memory according to claim 1, wherein:
the ion source layer contains an element selected from the group consisting of copper, silver, and zinc and contains an element selected from the group consisting of tellurium, sulfur, and selenium; and
the storage layer comprises an oxide selected from the group consisting of gadolinium oxide, tantalum oxide, niobium oxide, aluminum oxide, hafnium oxide, zirconium oxide, and a mixture of at least two of these oxides.

4. The semiconductor memory according to claim 3, wherein the ion source layer is a layer of copper-tellurium.

5. The semiconductor memory according to claim 1, wherein the variable resistance layer comprises a solid electrolyte film which has one or more of silver and copper and one or more of germanium sulfide, germanium-selenium, tin-selenium, and tin-germanium-selenium.

6. The semiconductor memory according to claim 1, wherein the variable resistance layer comprises a metallic oxide selected from the group consisting of titanium oxide, nickel oxide, zirconium oxide, and strontium zirconate.

7. The semiconductor memory according to claim 1, wherein the first electrode is formed over the common diffusion layer, with a barrier metal layer.

8. A method of manufacturing a semiconductor memory, comprising the steps of:
forming a first gate electrode and a second gate electrode over a semiconductor substrate, respectively with a gate insulating film between them and the semiconductor substrate;
forming first side wall insulating films and second side wall insulating films at respective side walls of the first gate electrode and the second gate electrode;
forming first diffusion layers in the semiconductor substrate on both lateral sides of the first gate electrode;
forming second diffusion layers in the semiconductor substrate on both lateral sides of the second gate electrode in such a manner that one of the second diffusion layers and one of the first diffusion layers constitute a common diffusion layer; and
forming a variable resistance element over the common diffusion layer between the first side wall insulating film and the second side wall insulating film,
wherein,
the step of forming the variable resistance element comprises the steps of
(a) forming a first electrode over the common diffusion layer between the first side wall insulating film and the second side wall insulating film,
(b) forming a variable resistance layer over the first electrode between the first side wall insulating film and the second side wall insulating film by (i) forming over the first electrode a storage layer including a metallic oxide, and (ii) forming over the storage layer an ion source layer which supplies metallic ions to the storage layer or accepts metallic ions supplied to the storage layer, and
(c) forming a second electrode over the variable resistance layer.

9. The method according to claim 8, wherein:
the ion source layer contains an element selected from the group consisting of copper, silver, and zinc and contains an element selected from the group consisting of tellurium, sulfur, and selenium; and
the storage layer comprises an oxide selected from the group consisting of gadolinium oxide, tantalum oxide, niobium oxide, aluminum oxide, hafnium oxide, zirconium oxide, and a mixture of at least two of these oxides.

* * * * *